United States Patent [19]

Sugimoto et al.

[11] Patent Number: 5,700,562
[45] Date of Patent: Dec. 23, 1997

[54] FLEXIBLE PRINTED CIRCUIT AND MANUFACTURING METHOD THEREFOR

[75] Inventors: Toshihiko Sugimoto; Chiharu Miyaake; Yousuke Miki, all of Osaka, Japan

[73] Assignee: Nitto Denko Corporation, Osaka, Japan

[21] Appl. No.: 701,954

[22] Filed: Aug. 23, 1996

[30] Foreign Application Priority Data

| Aug. 24, 1995 | [JP] | Japan | 7-216069 |
| Sep. 26, 1995 | [JP] | Japan | 7-247774 |
| Nov. 9, 1995 | [JP] | Japan | 7-291346 |
| Jan. 9, 1996 | [JP] | Japan | 8-001758 |

[51] Int. Cl.$^6$ .............. B32B 5/16; B32B 3/00; H05K 1/00
[52] U.S. Cl. .............. 428/327; 428/209; 428/901; 361/749; 361/750
[58] Field of Search .............. 428/209, 901, 428/327; 361/749, 750

[56] References Cited

U.S. PATENT DOCUMENTS

| 3,346,415 | 10/1967 | Hachenberger | 428/210 |
| 4,311,749 | 1/1982 | Hiraiwa et al. | 428/209 |
| 5,374,469 | 12/1994 | Hino et al. | 428/209 |

FOREIGN PATENT DOCUMENTS

| 5-116242 | 5/1993 | Japan | B32B 7/02 |
| 6-143435 | 5/1994 | Japan | B29C 65/74 |

*Primary Examiner*—Cathy F. Lam
*Attorney, Agent, or Firm*—Sughrue, Mion, Zinn, Macpeak & Seas, PLLC

[57] ABSTRACT

A composite sheet comprises a first resin film; and a second resin film laminated on the first resin film; wherein two ellipses of coefficient of linear expansion are created on polar coordinates in corresponding parts of the first and second resin films by a predetermined method and the two ellipse are overlapped so as to match in the center point and coordinate axes X and Y, and the maximum value of a linear expansion coefficient difference between the two resin films is equal to or less than a predetermined value.

33 Claims, 21 Drawing Sheets

|r|: ABSOLUTE VALUE OF LINEAR EXPANSION COEFFICIENT
θ : MEASUREMENT ANGLE

○ MEASUREMENT DATA
◂--▸ CRYSTAL ORIENTATION SUB AXIS
◂—▸ CRYSTAL ORIENTATION MAIN AXIS

FLEXIBLE PRINTED CIRCUIT AND MANUFACTURING METHOD THEREFOR

BACKGROUND OF THE INVENTION

This invention relates to a flexible printed circuit of a functional part used mainly in electric and electronic fields and a manufacturing method therefor.

Hitherto, printed circuits rich in flexibility have been commonly called flexible printed circuits and generally used in fields of electronics, etc. Generally, to form the flexible printed circuit, a material film is stretched in two directions of machine and transverse directions and two or more plastic films are cut out to a predetermined size from the stretched film and are laminated on each other. The machine and transverse directions mean longitudinal and lateral directions of the material film. FIG. 16A shows an example of the flexible printed circuit. A flexible printed circuit 1 comprises predetermined metal electric circuit 3 formed on a plastic film 4 made of polyimide, polyester, etc., (for a base layer) by a printing technique, a subtractive method, or the like and a plastic film 2 (for a cover layer) similar to the plastic film 4 furthermore formed on the metal electric circuit 3. Generally, an adhesive is used to laminate the plastic films 2 and 4 (laminate bond). An adhesive layer is not shown in FIG. 16A.

FIG. 16B shows a general structure of the flexible printed circuit. As shown here, the flexible printed circuit comprises an adhesive layer 8 formed on a plastic film 4 (for a base layer), metal electric circuit 3 formed on the adhesive layer 8, and an adhesive layer 8 formed on a plastic film 2 (for a cover layer) with both plastic films 2 and 4 laminated on each other with their respective adhesive layers 8 facing each other.

The flexible printed circuit, on which electronic parts such as semiconductor devices are mounted, requires precision of its shape. However, warpage called a curl as shown in FIG. 17A occurs in the manufacturing process of the flexible printed circuit. That is, in manufacturing of the flexible printed circuit, plastic films are laminated by pressurization and heat treatment of laminate, etc., and in addition, heat treatment is executed in curing a thermosetting adhesive, in a printing process, etc. When the plastic film lamination (flexible printed circuit) subjected to such heat treatment is restored to room temperature, a curl occurs. The curl occurring on the flexible printed circuit is not a simple curl like warping in one direction and is a so-called twisted curl of warping in opposite directions in two diagonal line directions on a rectangular flexible printed circuit as shown in FIG. 17B.

For example, sticking of a thick curl prevention film is proposed as a method of preventing the flexible printed circuit from curling in Japanese Patent Application No. Hei. 7-95987. However, such a method somewhat suppresses curl owing to the tare weight of the curl prevention film and is not much effective for fundamental curl suppression; in addition, there is a fear of impairing flexibility, an important property of the flexible printed circuit. If flexibility is impaired, a new problem that the essential property of the flexibility printed circuit cannot be satisfied occurs. Therefore, the method cannot fundamentally solve the curl problem and if curl is suppressed, the essential performance of the flexible printed circuit is not provided.

Thus, curl occurrence raises a problem from the beginning of development of the flexible printed circuit and is still an important problem to be solved at present after a lapse of about twenty years since that time. Providing sufficient flexibility of the flexible printed circuit in addition to suppressing curl occurrence is also left as an important problem to make the most of the essential performance of the flexible printed circuit.

On the other hand, a comparatively thin reinforcing plastic film (stiffener) to such a degree that it does not impair flexibility is stuck on some flexible printed circuits used at places where reasonable rigidity as well as flexibility is required, such as connectors. In this case, as shown in FIG. 26A, plastic films 2 and 4 and a reinforcing plastic film 7 used with the flexible printed circuit differ in thickness and material lot, thus the structure of the flexible printed circuit becomes asymmetrical in the cross-sectional direction. Such a flexible printed circuit of asymmetrical structure on which the reinforcing plastic film 7 is stuck is furthermore disadvantageous from a stand point of curl occurrence.

Further, to form flexible printed circuits, plastic films are stacked via an adhesive layer and the plastic films in stacked relation are crimped for lamination. However, since the plastic films, metal electric circuit, and the adhesive layers vary in thickness, the entire flexible printed circuit also varies in thickness; partially excessive pressure is applied to the flexible printed circuit crimped under mechanical pressure with a general press, etc., for extending the flexible printed circuit itself in a transverse direction, and the flexible printed circuits thus manufactured may vary in performance, etc., in some cases.

SUMMARY OF THE INVENTION

It is therefore an object of the invention to provide a flexible printed circuit whose curl occurrence is prevented, and a manufacturing method therefor.

According to a first aspect of the invention, there is provided a flexible printed circuit comprising two or more plastic films laminated on each other, the two or more plastic films being stretched in two directions of a machine direction and a transverse direction, wherein two plastic films of the laminated plastic films positioned on both outermost layers have the following relationship: Two ellipses of coefficient of linear expansion are created on coordinates in corresponding parts of film surfaces of the two plastic films by a method (A) described below and are overlapped so that they match in center point and coordinate axes X and Y. At this time, the maximum value of a linear expansion coefficient difference between the two plastic films is equal to or less than $1.4 \times 10^{-5}$ (1/°C.):

(A) comprising the steps of defining a predetermined base point P on the film surface of the plastic film, measuring a coefficient of linear expansion at a position separate from an arbitrary axis in angle θ direction on the first and second resin films, the arbitrary axis being selected on the first and second resin films so as to pass through the base point P with the base point P as a center and direct an arbitrary direction, on the other hand, preparing a coordinate system with the arbitrary axis as a Y axis and an axis crossing the Y axis at 90 degrees as an X axis, in this coordinate system, defining an intersection of the X and Y axes as the base point P in the linear expansion coefficient measurement and magnitude of a linear expansion coefficient measurement value as distance r from the base point P, then plotting a tip point of this distance r in the measurement angle θ direction with respect to the Y axis, plotting it multiple times by changing the measurement angle θ, and drawing an analysis line throughout 360-degree directions with the base point P as the center so as to pass through average points of the plotted points for creating an ellipse.

According to the invention, there is provided a flexible printed circuit comprising two or more plastic films laminated on each other, the two or more plastic films being stretched in two directions of a machine direction and a transverse direction, wherein two plastic films of the laminated plastic films positioned on both outermost layers have the following relationship: When two ellipses of coefficient of linear expansion are created on coordinates in corresponding parts of film surfaces of the two plastic films by the method (A) described above and are overlapped so that they match in center point and coordinate axes X and Y, the total area of portions where the ellipses do not overlap is equal to or less than $6.5 \times 10^{-10}$ [$(1/°C.) \times (1/°C.)$].

According to the invention, there is provided a flexible printed circuit comprising two or more plastic films laminated on each other, the two or more plastic films being stretched in two directions of a machine direction and a transverse direction, wherein two plastic films of the laminated plastic films positioned on both outermost layers have the following relationship: When ultrasonic propagation velocity ellipses are created on coordinates in corresponding parts of film surfaces of the two plastic films by a method (B) described below and are overlapped so that they match in center point and coordinate axes X and Y, a shift angle difference between crystal orientation main axes of the ellipses ($\Delta\theta$) is within 30 degrees:

(B) comprising the steps of defining a predetermined base point P on the film surface of the plastic film, measuring a ultrasonic propagation velocity at a position separate from an arbitrary axis in angle $\theta$ direction on the first and second resin films, the arbitrary axis being selected on the first and second resin films so as to pass through the base point P with the base point P as a center and direct an arbitrary direction, on the other hand, preparing a coordinate system with the arbitrary axis as a Y axis and an axis crossing the Y axis at 90 degrees as an X axis, in this coordinate system, defining an intersection of the X and Y axes as the base point P in the ultrasonic propagation velocity measurement and magnitude of a ultrasonic propagation velocity measurement value as distance from the base point P, then plotting a tip point of this distance r in the measurement angle $\theta$ direction with respect to the Y axis, plotting it multiple times by changing the measurement angle $\theta$, and drawing an analysis line throughout 360-degree directions with the base point P as the center so as to pass through average points of the plotted points for creating an ellipse having a crystal orientation main axis in a long-axis direction and a crystal orientation subaxis in a short-axis direction.

In the flexible printed circuit as described, the two plastic films of the laminated plastic films positioned on both the outermost layers may be laminated on each other with the same surfaces of the two plastic films facing each other.

Further, in the flexible printed circuit as described, metal electric circuit is formed in at least one of two or more laminated plastic films stretched in two directions of a machine direction and a transverse direction and wherein a product of thickness and tensile modulus of the metal electric circuit is 500 kg/mm or less.

According to the invention, there is provided a flexible printed circuit comprising two or more plastic films laminated on each other, the two or more plastic films being stretched in two directions of a machine direction and a transverse direction, and having a board face on which a reinforcing plastic film is stuck, wherein a plastic film of the laminated plastic films positioned on an outermost layer on a side where the reinforcing plastic film is not stuck and the reinforcing plastic film have the following relationship: Two ellipses of coefficient of linear expansion are created on coordinates in corresponding parts of film surfaces of the two plastic films by the method (A) described above and are overlapped so that they match in center point and coordinate axes X and Y. At this time, the maximum value of a linear expansion coefficient difference between the two plastic films is equal to or less than $1.4 \times 10^{-5}$ ($1/°C.$).

According to the invention, there is provided a flexible printed circuit comprising two or more plastic films laminated on each other, the two or more plastic films being stretched in two directions of a machine direction and a transverse direction, and having a board face on which a reinforcing plastic film is stuck, wherein a plastic film of the laminated plastic films positioned on an outermost layer on a side where the reinforcing plastic film is not stuck and the reinforcing plastic film have the following relationship: When two ellipses of coefficient of linear expansion are created on coordinates in corresponding parts of film surfaces of the two plastic films by the method (A) described above and are overlapped so that they match in center point and coordinate axes X and Y, the total area of portions where the ellipses do not overlap is equal to or less than $6.5 \times 10^{-10}$ [$(1/°C.) \times (1/°C.)$].

According to the invention, there is provided a flexible printed circuit comprising two or more plastic films laminated on each other, the two or more plastic films being stretched in two directions of a machine direction and a transverse direction, and having a board face on which a reinforcing plastic film is stuck, wherein a plastic film of the laminated plastic films positioned on an outermost layer on a side where the reinforcing plastic film is not stuck and the reinforcing plastic film have the following relationship: When ultrasonic propagation velocity ellipses are created on coordinates in corresponding parts of film surfaces of the two plastic films by the method (B) described above and are overlapped so that they match in center point and coordinate axes X and Y, a shift angle difference between crystal orientation main axes of the ellipses ($\Delta\theta$) is within 30 degrees.

In the flexible printed circuit as described, a plurality of plastic films stacked via an adhesive layer may be temporarily crimped by a roll laminate method in stacked relation and then pressurized under gas pressure in an autoclave and crimped.

According to the invention, there is provided a method of manufacturing a flexible printed circuit comprising the steps of stacking a plurality of plastic films via an adhesive layer, temporarily crimping the stacked plastic films by a roll laminate method in stacked relation, and then pressurizing them under gas pressure in an autoclave, thereby crimping them.

In the above methods (A) and (B), an arbitrary axis is selected arbitrarily on the two plastic films, and a coordinate system with the arbitrary axis as a Y axis and an axis crossing the Y axis at 90 degrees as an X axis is prepared. However, it is allowed to settle an axis of the machine direction of plastic film stretch as the Y axis and an axis of the transverse direction of plastic film stretch as an X axis.

In the invention, the coefficient of linear expansion $\alpha$ is derived as follows: When a plastic film is heated, it expands in response to the characteristics of the plastic film. At this time, the coefficient of linear expansion $\alpha$ can be found according to the following expression (1) from the change ratio of the length of the plastic film, p, to temperature t at the measurement time ($\partial p/\partial t$) and the length of the film, p0, at 0° C. (Kagaku Binran-Kisohen II, edited by Nippon Kagakukai, published by Maruzen Shuppan).

$$\alpha = 1/\rho_0 \times \partial/\partial t \quad (1)$$

However, the coefficient of linear expansion α mentioned in the invention refers to that in region of glass transfer temperature of plastic film (Tg) or less. Since Tg of the plastic films to which the invention is applied is in the temperature range exceeding the room temperature (about 23° C.) and a twisted curl becomes a problem in a temperature region near the room temperature, the coefficient of linear expansion at Tg or softening point or less becomes the target. Tg of polyimide films is 300° C. or more, which exceeds the operating temperature range, and does not clearing appear, thus the necessity for considering Tg of polyimide films is small.

In the invention, the total area of portions where ellipses do not overlap (C) is defined by the following expression (2) representing the integral value of linear expansion coefficient square value differences ($\Delta\alpha c$). That is, in the invention, the total area of portions where ellipses do not overlap (C) is synonymous with the integral value of linear expansion coefficient square value differences ($\Delta\alpha c$). In the following expression (2), θ is a linear expansion coefficient measurement angle with the axis of the machine direction of stretch as the reference and $\Delta\alpha c$ (θ) is defined by the following expression (3). The ellipses in the invention contain perfect circles.

$$C = 1/2 \int_0^{2\pi} \Delta\alpha_c(\theta) d\theta \quad (2)$$

$$\Delta\alpha_c(\theta) = |r_1^2(\theta) - r_2^2(\theta)| \quad (3)$$

Further, the ultrasonic propagation velocity in the invention refers to a measurement value of the propagation time (s) or the propagation velocity (m/s) when a ultrasonic pulse (frequency: 25 MHz) is passed through a plastic film and propagates in the plastic film at a predetermined distance.

In the invention, the flexible printed circuit is not limited if it comprises two or more plastic films laminated (laminated and bonded) and is intended for use as a printed circuit. Therefore, in the invention, printed circuits not yet formed with metal electric circuit or those formed with a metal thin film before formation of an electric circuit pattern are also contained in the flexible printed circuits.

In the invention, the expression "both the outermost layers" of "two plastic films positioned on both the outermost layers, of laminated plastic films" does not mean both the outermost layers of the flexible printed circuit and is used to mean both the outermost layers in the plastic film laminate. Therefore, for example, if a flexible printed circuit comprises a shielding layer formed on a plastic film laminate by painting, printing, etc., the shielding layer is not contained in "both the outermost layers" in the invention. Even for a flexible printed circuit on which a reinforcing plastic film is stuck, if the reinforcing plastic film is contained in a plastic film laminate and is stuck on the board face, it forms one of "both the outermost layers" in the invention.

In the invention, the expression "curl suppression" refers to the case where the curl degree (%) defined below becomes 5% or less. Assume that the length of the long side of the smallest rectangle in which a flexible printed circuit is inscribed is the longest length of the flexible printed circuit, L. FIG. 14 shows an example of smallest rectangle 21 in which a flexible printed circuit 1a like a substantial V-shape is inscribed. As shown here, in the flexible printed circuit 1a, the length of the long side of the rectangle 21 indicated by the dotted line becomes the longest length L. As shown in FIG. 15, one end of the flexible printed circuit 1a is fixed to a reference plane 6 and the height of the maximum warpage of the flexible printed circuit 1a from the reference plane 6, h, is found and is defined as curl amount h. The percentage of the curl amount h to the longest length of the flexible printed circuit, L, namely, (h/L)×100 is defined as the curl degree (%).

In the invention, the tensile modulus is a value indicating the rigidity of a metal thin film forming metal electric circuit and refers to elastic stress per unit elastic strain (kg/mm$^2$). It is measured as follows: When a predetermined load is imposed on a metal thin film (metal foil) forming metal electric circuit with a tensile tester and constant elastic strain is given, the elastic stress is measured as the tensile modulus. The tensile modulus is measured with metal foil. It can be used as a typical value as the tensile modulus of a metal thin film, and can be used even if a film other than metal foil, such as an evaporation film, is formed as the metal thin film of metal electric circuit. In this case, preferably the composition of metal foil used instead is made the same, the same heat history is given, and the resultant crystal state, etc., is set like the metal thin film of the actual flexible printed circuit.

Next, the technical philosophy of the invention will be discussed.

To solve the problem of curl occurrence of flexible printed circuits, the inventor et al. first carried out a detailed analysis of the cause of curl occurrence of flexible printed circuits. As a result, the inventor et al. have found that curl occurrence is caused by the linear expansion coefficient difference between plastic films. If different materials are laminated, it can be easily imagined that warpage (curl) occurs because they differ in coefficient of linear expansion. Normally, flexible printed circuits use plastic films (for example, base and cover layer films) made of the same material and therefore formerly it was considered that the plastic films made of the same material do not differ in coefficient of linear expansion. However, the inventor et al. actually measured coefficients of linear expansion in detail and found that the plastic films of each flexible printed circuit differs in coefficient of linear expansion. Nobody in the flexible printed circuit field found this knowledge until the inventor et al. found it.

The inventor et al. continued to examine the linear expansion coefficient difference and found that each bidirectionally stretched plastic film used with a flexible printed circuit shows anisotropy in its coefficient of linear expansion. That is, a predetermined base point P is defined on the film surface of the plastic film and the coefficient of linear expansion in angle θ direction with respect to the axis of the machine direction of plastic film stretch passing through the base point P with the base point P as the center is measured. On the other hand, a coordinate system with the axis of the machine direction of plastic film stretch as a Y axis and the axis of the transverse direction of plastic film stretch as an X axis is prepared. In this coordinate system, the intersection of the X and Y axes is defined as the base point P in the linear expansion coefficient measurement and the magnitude of the linear expansion coefficient measurement value is defined as distance r from the base point P, then the tip point of this distance r is plotted in the measurement angle θ direction with respect to the Y axis. It is plotted multiple times by changing the measurement angle θ and an analysis line is drawn throughout 360-degree directions with the base point P as the center so as to pass through average points of the plotted points. Then, an ellipse as shown in FIG. 1 is provided. In the figure, MD denotes the axis of the machine direction of stretch (Y axis) and TD denotes the axis of the transverse direction of stretch (X axis). Solid line arrow A indicates the crystal orientation main axis of the plastic film and dotted line arrow B indicates the crystal orientation subaxis of the plastic film. Also, θ is a linear expansion coefficient measurement angle with respect to MD. r represents the linear expansion coefficient magnitude as a distance from the base point P and has a tip plotted with O. Such plotting is called polar coordinate plotting. As seen from the ellipse provided by the polar coordinate plotting (see FIG. 1), normally the crystal orientation main axis of the plastic film (arrow A) becomes a direction inclined from the machine direction of stretch (MD) and the coefficient of linear expansion also vary depending on the direction (anisotropy) because of anisotropy of the crystal orientation. Resultantly, it is considered that the analysis line of the coefficients of linear expansion of the bidirectionally stretched plastic film shows an ellipse.

Next, as shown in FIG. 2, when ellipses on coordinates provided for two stretched plastic films made of the same material are overlapped so that they match in center point and coordinate axes, it is seen that the two plastic films differ in crystal orientation direction and coefficient of linear expansion in parts (directions). Normally, a raw material film is stretched in two directions, from which plastic films used with a flexible printed circuit are cut out to a predetermined size. Therefore, the reason why the plastic films made of the same material differ in linear expansion coefficient may be that the stress applied when the plastic film is stretched in two directions varies from one part of the plastic film to another.

The inventor et al. examined a method for controlling the linear expansion characteristic difference between the plastic films provided when ellipses created by polar coordinate plotting are overlapped and suppressing curl occurrence of flexible printed circuits. In the process, the inventor et al. hit on an idea of using indexes of the maximum value of the linear expansion coefficient difference (Δα) and the total area of portions where ellipses do not overlap (C) and repeated various experiments based on the idea. Resultantly, the inventor et al. have found that if the maximum value of the linear expansion characteristic difference (Δα) provided when ellipses created for two plastic films positioned on both the outermost layers, of two or more laminated plastic films making up a flexible printed circuit are overlapped is equal to or less than $1.4 \times 10^{-10}$ (1/°C.), curl occurrence of the flexible printed circuit is suppressed. Likewise, the inventor et al. have found that if the total area of the portions where the ellipses do not overlap when they are overlapped (C) is set equal to or less than $6.5 \times 10^{-10}$ [(1/°C.)×(1/°C.)], curl occurrence of the flexible printed circuit is also suppressed.

The point to be noted is that only the two plastic films positioned on both the outermost layers, of laminated plastic films making up the flexible printed circuit need to satisfy at least one of the two conditions. Therefore, a plastic film positioned on an intermediate layer need not be considered.

Next, examples of the experiment results from which the predetermined values were derived are shown in graphs of FIGS. 4 and 5. In the experiments, the curl amounts were measured by the above-described method and the coefficients of linear expansion were measured by TMA (thermal mechanical analysis). The maximum value of the linear expansion coefficient difference (Δα) and the total area of portions where ellipses do not overlap (C) were derived by a method described later.

The graph of FIG. 4 represents the relationship between the ratio between the curl amount and length [curl degree (%)] and the maximum value of the linear expansion coefficient difference (Δα). As shown here, it is seen that both indicate a linear relationship and that the maximum value of the linear expansion coefficient difference (Δα) at which curl occurrence is reliably suppressed (the curl degree is 5% or less) is $1.4 \times 10^{-10}$ (1/°C.).

On the other hand, the graph of FIG. 5 represents the relationship between the ratio between the curl amount and length [curl degree (%)] and the total area of portions where ellipses do not overlap (C). As shown here, it is seen that both indicate a relationship like a quadratic curve and that the total area of portions where ellipses do not overlap (C) at which curl occurrence is reliably suppressed (the curl degree is 5% or less) is $6.5 \times 10^{-10}$ [(1/°C.)×(1/°C.)].

The two indexes of the maximum value of the linear expansion coefficient difference (Δα) and the total area of portions where ellipses do not overlap (C) can and should be used at the same time.

Further, the inventor et al. thought that an index for furthermore facilitating control of the linear expansion characteristic difference might exist and repeated examination based on the knowledge that anisotropy of the coefficients of linear expansion as described above is caused by the fact that the stress applied when a plastic film is stretched in two directions varies from one part of the plastic film to another and thus the stretch coefficient varies from one part to another. The inventor et al. supposed that since a bidirectionally stretched plastic film is high in crystal orientation degree in high stretch coefficient direction and the material strength of the plastic film itself raises, its Young's modulus might also increase. Further, since the Young's modulus of each plastic film (E) and the ultrasonic propagation velocity in the plastic film (S) show a correlation as indicated by general expression (4) given below, the inventor et al. hit on an idea that there might be a correlation between the coefficient of linear expansion (α) and the ultrasonic propagation velocity (S), and repeated various experiments based on the idea. Resultantly, the inventor et al. have found that the ultrasonic propagation velocity (S) and the coefficient of linear expansion (α) of a bidirectionally stretched plastic film show an extremely good correlation and that the ultrasonic propagation velocity (S) can be used as an index indicating the coefficient of linear expansion (α).

$$E \propto \rho S^2 \qquad (4)$$

where ρ is the plastic film density.

An example of the experiment results from which the correlation was derived is shown in a graph of FIG. 34. In the experiment, the coefficients of linear expansion were measured by the above-mentioned TMA (thermal mechanical analysis) and the ultrasonic propagation velocities were measured with SST [sonic sheet tester, ultrasonic propagation velocity measuring instrument (on sale from Nomura Shoji Kabusikigaisha)]. As shown in FIG. 34, it is seen that both indicate a linear relationship and shows an extremely good correlation.

The inventor et al. continued to examine the ultrasonic propagation velocities and can recognize that bidirectionally stretched plastic films used with flexible printed circuits show anisotropy in the ultrasonic propagation velocities as with the linear expansion coefficients. That is, when a predetermined base point P was defined on the film surface of a plastic film, a polar coordinate system was set, ultrasonic propagation velocities were measured throughout 360-degree directions with the base point P as the center, and an analysis line was drawn as in the above-described linear expansion coefficient measurement, an ellipse as shown in FIG. 27 was provided on the coordinates. At this time, arrow A in the long-axis direction of the ellipse indicates the crystal orientation main axis of the plastic film and likewise arrow B in the short-axis direction of the ellipse indicates the crystal orientation subaxis of the plastic film. As seen from the ellipse provided by the polar coordinate plotting (see FIG. 27), the crystal orientation main axis of the plastic film (arrow A) becomes a direction inclined from the machine direction of stretch (MD) and the ultrasonic propagation velocities also show anisotropy because of anisotropy of the crystal orientation.

The inventor et al. examined a method for controlling the ultrasonic propagation velocity (namely, linear expansion characteristic) difference between the plastic films provided when ellipses created by polar coordinate plotting are overlapped and suppressing curl occurrence of flexible printed circuits. Resultantly, the inventor et al. have found that when ellipses created for two plastic films positioned on both the outermost layers, of two or more laminated plastic films making up a flexible printed circuit are overlapped, as shown in FIG. 28, if the shift angle difference between crystal orientation main axes of the ellipses ($\Delta\theta$) is within 30 degrees, curl occurrence of the flexible printed circuit is suppressed.

A graph of FIG. 29 represents the relationship between the ratio between the curl amount and length [curl degree (%)] and the shift angle difference between crystal orientation main axes ($\Delta\theta$). As shown here, it is seen that both indicate a linear relationship and that the maximum value of the shift angle difference between crystal orientation main axes ($\Delta\theta$) at which curl occurrence is reliably suppressed (the curl degree is 5% or less) is 30 degrees.

The shift angle difference between crystal orientation main axes ($\Delta\theta$) can be used instead of the two indexes described above of the maximum value of the linear expansion coefficient difference ($\Delta\alpha$) and the total area of portions where ellipses do not overlap (C), and two or all of them can also be used together.

If the shift angle difference between crystal orientation main axes ($\Delta\theta$) is used, only the two plastic films positioned on both the outermost layers, of laminated plastic films making up the flexible printed circuit need to satisfy the condition and a plastic film positioned on an intermediate layer need not be considered as in the case where the maximum value of the linear expansion coefficient difference ($\Delta\alpha$) and the total area of portions where ellipses do not overlap (C) are used as indexes.

Hereupon, as described above, one of the three conditions, that is, the maximum value of the linear expansion coefficient difference ($\Delta\alpha$), the total area of portions where ellipses do not overlap (C), and the maximum value of the shift angle difference between crystal orientation main axes ($\Delta\theta$) are satisfied by only the two plastic films positioned on both the outermost layers. Therefore, the directions of the coordinate axes of the ellipses may be selected arbitrarily on the plastic film. In other words, the Y axis of the coordinate is not limited to the machine direction of the plastic film. After the Y axis and the X axis are settled in the arbitrary directions to prepare the coordinate system, the ellipses are created on such coordinates. The two plastic films positioned on both the outermost layers may be selected by using the above ellipse and three conditions.

Next, in the invention, to laminate two or more plastic films, the two plastic films positioned on both the outermost layers may have the same surfaces thereof faced each other. Normally, the surface and rear face of a plastic film cut out from a raw material film stretched in two directions differ plainly in surface (rear face) state of wet property, coarseness, etc. Therefore, if the two plastic films positioned on both the outermost layers are placed in a state in which the same surfaces face each other as described above, the rear faces of the two plastic films exist on the surface and rear face of the flexible printed circuit and the surface and rear face of the flexible printed circuit become the same state. This eliminates the need for considering the difference between the surface and rear face to apply various treatments to the flexible printed circuit; the effect of enhancing work efficiency, etc., is produced.

In the invention, the surface and rear face of a plastic film are determined appropriately; for example, to cut a raw material film, the upper face can be made the surface and the lower face can be made the rear face. For example, as shown in FIG. 21, the upper face of a raw material film 10 is made a surface 9 and two plastic films 2 and 4 are cut out from the raw material film. Each of the plastic films 2 and 4 comprises the same surface 9 as the raw material film 10. As shown in FIG. 22A, the plastic films 4 and 2 are overlapped with their surfaces 9 facing each other. FIG. 22B is a sectional view to show a state of overlapping the plastic films 2 and 4 with their surfaces 9 facing each other.

Next, in the invention, to prevent curl occurrence and provide sufficient flexibility, the physical property of metal electric circuit of a flexible printed circuit is specified by a special index (K) originally found by the inventor et al. That is, metal electric circuit, which is the main component of a flexible printed circuit, largely affects flexibility of the flexible printed circuit. Then, the inventor et al. carried out a detailed analysis on the cause for producing flexibility for the metal electric circuit, and found that the tensile modulus and thickness of the metal electric circuity are the main factors affecting flexibility of the flexible printed circuit. When continuing furthermore examination on the relationship between the two factors, the inventor et al. hit on an idea that the product of the tensile modulus and thickness (K) can become one of indexes on flexibility of the flexible printed circuit. When continuing various experiments based on the idea, the inventor et al. recognized that the index (K) can be used universally for flexibility of the flexible printed circuit regardless of the type of metal electric circuit as expected. Based on the index (K), the inventor et al. have found that if the product of the tensile modulus and thickness (K) is set to 500 kg/mm or less in the relationship with the two conditions of the coefficients of linear expansion of plastic films, curl occurrence prevention means described above, curl occurrence can be prevented and sufficient flexibility can be provided.

Next, in the invention, in a flexible printed circuit on which a reinforcing plastic film is stuck, the linear expansion characteristic difference between a plastic film of laminated plastic films on the side where the reinforcing plastic film is not stuck and the reinforcing plastic film is controlled for suppressing curl occurrence. That is, in the flexible printed circuit on which a reinforcing plastic film is stuck, the reinforcing plastic film and other plastic films differ in thickness, etc., and the structure of the flexible printed circuit becomes asymmetrical with respect to the cross-section direction, thus the flexible printed circuit becomes prone to curl as compared with normal flexible printed circuits on which no reinforcing plastic film is stuck. If a curl of the flexible printed circuit itself is suppressed, the flexible printed circuit may again curl by stacking a reinforcing plastic film thereon. However, the inventor et al. have found that in the cases, if the maximum value of the linear expansion characteristic difference ($\Delta\alpha$) provided when ellipses created by polar coordinate plotting for the plastic film positioned on the outermost layer on the side where the reinforcing plastic film and the reinforcing plastic film are overlapped is equal to or less than $1.4 \times 10^{-5}$ (1/°C.), curl occurrence of the flexible printed circuit on which the reinforcing plastic film is stuck is suppressed.

Likewise, the inventor et al. have found that if the total area of the portions where the ellipses do not overlap when they are overlapped (C) is set equal to or less than $6.5 \times 10^{-10}$ [(1/°C.)×(1/°C.)], curl occurrence of the flexible printed circuit on which the reinforcing plastic film is stuck is also suppressed. Likewise, the inventor et al. have found that when the ellipses created by polar coordinate plotting are overlapped, if the shift angle difference between crystal orientation main axes of the ellipses ($\Delta\theta$) is within 30 degrees, curl occurrence of the flexible printed circuit on which the reinforcing plastic film is stuck is suppressed.

Next, in the invention, the raw material plastic film characteristics are applied for preventing curls from occurring in manufacturing flexible printed circuits and enhancing the manufacturing efficiency. That is, if either of the two conditions is satisfied, curl occurrence can be prevented, but it is troublesome to measure the linear expansion coefficient differences for each plastic film in manufacturing flexible printed circuits. Then, to solve this problem, the inventor et al. examined the linear expansion coefficient characteristics of raw material plastic films and found that there was given regularity. Then, the linear expansion coefficient ellipses of the parts of a raw material film are previously examined, the linear expansion coefficient characteristics are grasped and standardized, and parts cut out from the raw material plastic film and a combination of cut plastic films are previously determined. In doing so, the maximum value of the linear expansion coefficient difference and the total area of portions where the ellipses do not overlap can be set to the predetermined values or less without creating linear expansion coefficient ellipses for each plastic film. As a result, the production efficiency of flexible printed circuits with curl occurrence suppressed can be improved.

Next, the invention relates to a flexible printed circuit wherein plastic films laminated via an adhesive layer are temporarily crimped by a roll laminate method and then pressurized under gas pressure in an autoclave and crimped, and a manufacturing method therefor. That is, to manufacture a flexible printed circuit, when an adhesive layer is formed on each plastic film and then they are stacked and laminated, the flexible printed circuit is pressurized in a heating state in stacked relation to remove bubbles occurring in the adhesive layers. After the flexible printed circuit is temporarily crimped by a roll laminate method, it is sealed in an autoclave and pressurized under gas pressure for crimping, whereby the flexible printed circuit is crimped under isotropic pressure produced by the gas pressure. Thus, even if the flexible printed circuit itself varies in thickness, etc., it is pressurized on the full face under uniform gas pressure and no excessive force is applied to the materials of the plastic films, metal electric circuit, etc.,; the flexible printed circuit itself does not extend in the transverse direction or its characteristics are not impaired.

DETAILED DESCRIPTION OF THE PREFERRED EMBODIMENTS

Figure 1:
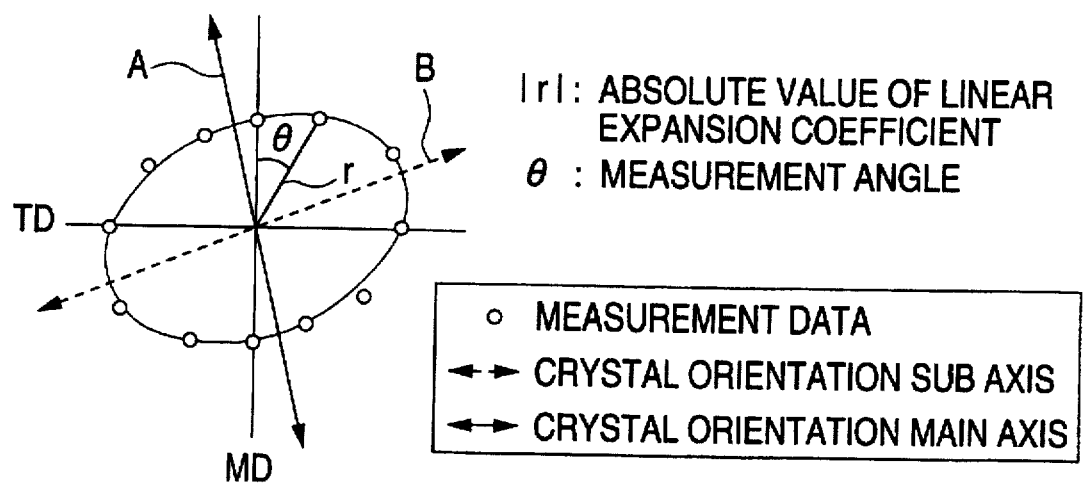
FIG. 1 is a polar coordinate plotting chart representing a linear expansion coefficient ellipse of a bidirectionally stretched plastic film.
Figure 2:
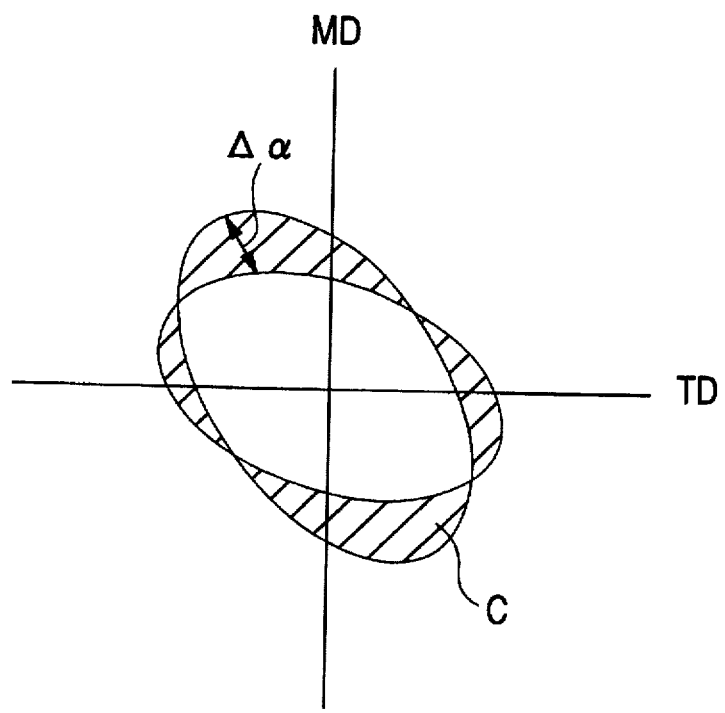
FIG. 2 is a polar coordinate plotting chart of overlapping two linear expansion coefficient ellipses.

Next, the invention will be discussed specifically.

A flexible printed circuit of the invention comprises two or more plastic films laminated on each other, the plastic films being manufactured by bidirectional stretch, and normally at least one of the two or more plastic films is formed with metal electric circuit.

For example, a polyimide film, a polyester nitrile film, a polyester sulfone film, a polyethylene terephthalate film, a polyvinyl chloride film and polyethylene naphthalate film can be listed as the plastic film types, among which the polyethylene terephthalate film, polyethylene naphthalate film and polyimide film are preferred totally considering heat resistance, dimension stability, electric characteristics, mechanical strength characteristics, chemical resistance, costs, etc. The plastic film normally is 0.01 to 0.3 mm thick and preferably 0.025 to 0.125 mm thick.

With flexible printed circuits on which a reinforcing plastic film is stuck, films of various materials manufactured by bidirectional stretch like those listed above are used as the reinforcing plastic films and normally are 0.025 to 0.500 mm thick and preferably 0.125 to 0.350 mm thick. However, the reinforcing plastic films as thick as or thicker than other films which constitute the flexible printed circuit itself are used.

It is appropriate to stretch the bidirectionally stretched plastic film generally 1.5 to 15 times and preferably 2 to 9 times in a machine direction and 3 to 8 times in a transverse direction.

Metal such as copper, gold, stainless, aluminum, and nickel and alloys thereof can be listed as the types of metal of the metal electric circuity, among which copper and a copper alloy are preferred totally considering flexibility, workability, electric characteristics, costs, etc. The metal electric circuit normally is 0.002 to 0.100 mm thick and preferably 0.005 to 0.070 mm thick. Further, when elasticity coefficient is measured in a foil state, it normally is 2000 to 20000 kg/mm$^2$ and preferably 4000 to 12000 kg/mm$^2$. For example, the elasticity coefficient can be measured conforming to ASTM D-882-83 with TENSILON TESTER (tensile tester). To measure the elasticity coefficient of metal electric circuit or a metal thin film in a flexible printed circuit completed as a product, a semi-finished product before pattern formation, or the like, additives of plastic films, adhesives, etc., are removed by a method such as plasma etching or excimer laser beam machining for leaving the metal electric circuit or metal thin film only, and the elasticity coefficient thereof in the state can be measured according to the above-mentioned method.

The invention uses an index of the product of the thickness and elasticity coefficient of metal electric circuit (K) so as to enable universal comparison in various metals. As the value, normally, foil metal takes a value of about 4 kg/mm (thickness: 0.002 mm×elasticity coefficient: 2000 kg/mm$^2$) to 2000 kg/mm (thickness: 0.100 mm×elasticity coefficient: 20000 kg/mm$^2$); to suppress a curl of the flexible printed circuit and provide flexibility thereof, desirably it lies in the range of 20 to 500 kg/mm and more preferably 30 to 250 kg/mm. For the elasticity coefficient values, the measurement value in the foil state as described above typifies the elasticity coefficient of metal thin film and if the composition, heat history, and crystal state virtually equal, the same value is taken even if metal thin films are other than metal foil (for example, evaporation film, plating coat, etc.,).

Normally, an adhesive is used to laminate (laminate and bond) two or more plastic films. A thermosetting adhesive (for example, an epoxy rubber adhesive or a polyester adhesive comprising an isocyanate curing agent added to a polyester resin), a thermoplastic adhesive (for example, a synthetic rubber adhesive), and a tackiness agent (pressure-sensitive adhesive, for example, an acrylic tackiness agent) can be listed as the adhesive, among which the thermosetting adhesive is preferred because it is good in characteristics of an adhesion force, heat resistance, moisture and heat resistance, workability, durability, etc. To laminate a reinforcing plastic film, the various adhesives are also used.

Next, a manufacturing method of the flexible printed circuit of the invention will be discussed.

Figure 16A:
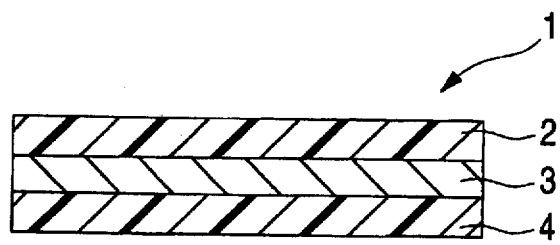
FIG. 16A is a sectional view to show the structure of a flexible printed circuit and 16B is a sectional view to show the structure of a flexible printed circuit having an adhesive layer formed on the surface of each of two plastic films.
Figure 16B:
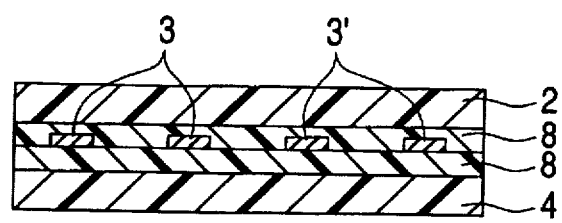
Figure 17A:
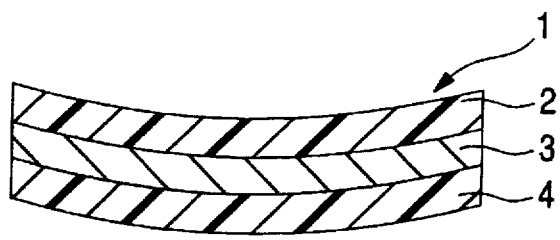
FIG. 17A is a sectional view of a flexible printed circuit on which a curl occurs and 17B is an illustration to show a state in which a twisted curl occurs on a flexible printed circuit.
Figure 17B:
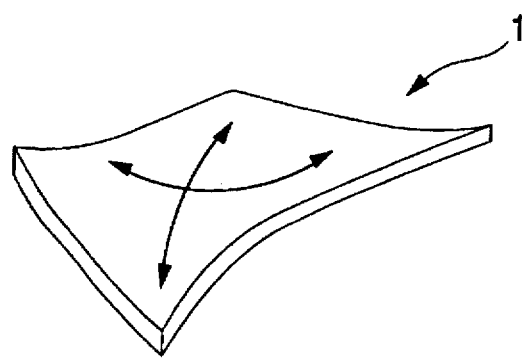

The manufacturing method of the flexible printed circuit of the structure wherein the two plastic films 2 and 4 shown in FIG. 16B are laminated and one of the plastic films is formed with the metal electric circuit 3 will be described as an example. First, two plastic films 2 and 4 are prepared. Generally, polyethylene terephthalate is used as the plastic films. As described above, the two plastic films 2 and 4 need to satisfy at least one of the conditions that when ellipses of coefficient of linear expansion are overlapped, the maximum value of the linear expansion coefficient difference ($\Delta\alpha$) should be equal to or less than $1.4\times10^{-10}$ [(1/°C.), that the total area of the portions other than the overlap (C) should be equal to or less than $6.5\times10^{-10}$ [(1/°C.)×(1/°C.)], or that when ellipses of ultrasonic propagation velocities are overlapped, the shift angle difference between crystal orientation main axes of the ellipses ($\Delta\theta$) should be within 30 degrees. The plastic films 2 and 4 of the same thickness are used, whereby curl occurrence can be prevented more efficiently.

Figure 18A:
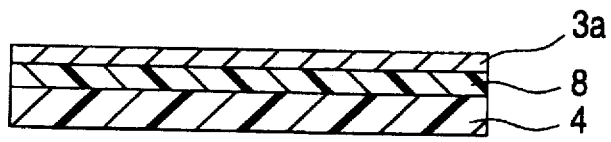
FIG. 18A is a sectional view to show a state in which an adhesive layer is formed on a base film and then copper foil is placed on the adhesive layer, 18B is a sectional view to show a state in which the copper foil is formed to electric circuit, 18C is a sectional view to show a state of laminating plastic films for base and cover layers, and 18D is a sectional view to show the structure of a flexible printed circuit thus provided.
Figure 18B:
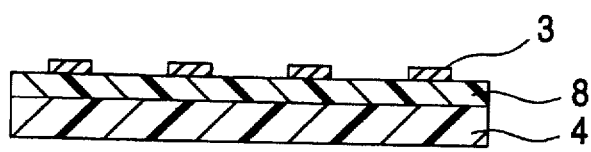

First, as shown in FIG. 18A, an adhesive layer 8 is formed on the surface of the plastic film 4 for the base layer, for example, by applying an adhesive onto the plastic film 4, then drying or by stacking an adhesive applied onto a separator on the plastic film 4, then removing the separator. The adhesive layer 8 normally is 0.003 to 0.2 mm thick and preferably 0.005 to 0.05 mm thick. Next, a metal thin film 3a is formed on the adhesive layer 8, for example, by placing metal foil such as copper foil on the adhesive layer 8 and roll laminate. The metal thin film 3a can also be formed by an electroplating method or a sputtering method, in which case it can be formed directly on the plastic film 4 without forming the adhesive layer 8. As shown in FIG. 18B, a known method such as a printing, subtractive, or additive method is used to treat the metal thin film 3a for forming metal electric circuit 3 in a predetermined circuit pattern. On the other hand, plastic film 2 for cover layer is prepared and an adhesive layer 8 is formed on the surface of the plastic film 2 in a similar manner to that described above. If the adhesive layer 8 is formed on the rear face of the plastic film 4 for the base layer, the adhesive layer 8 is formed on the rear face of the plastic film 2 for the cover layer.

Figure 18C:
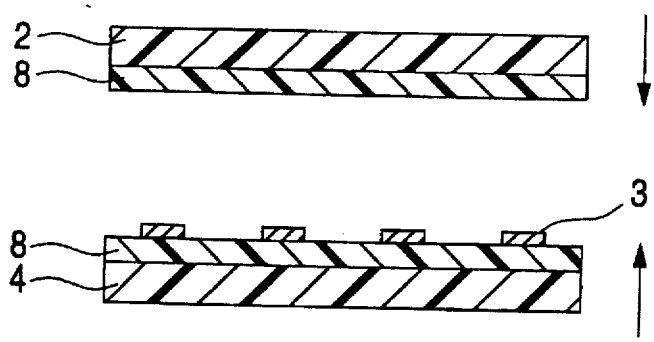

As shown in FIG. 18C, both the plastic film 4 for the base layer and the plastic film 2 for the cover layer are stacked with their surfaces facing each other and laminated (laminated and bonded) in the stacked relation, for example, by a crimping method with a heat press or by a laminate method of applying at least heat or pressure after temporary crimping by rolling and laminating. The laminating method and conditions are determined appropriately by the types of plastic films, adhesives, etc.

Figure 18D:
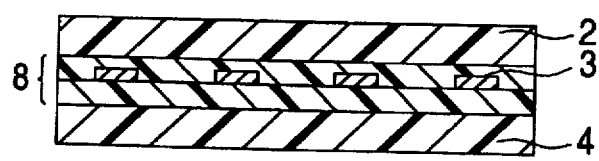

The flexible printed circuit as shown in FIGS. 18D or 16B can be thus manufactured. The pressure and temperature conditions common to the crimping method and the roll laminate method in the laminating normally are 40° C. to 300° C.×1 to 100 kg/cm² and preferably 50° C. to 200° C.×8 to 70 kg/cm².

In the laminating, if the plastic films in the stacked relation are temporarily crimped by the roll laminate method and then pressurized under gas pressure in an autoclave and crimped, the flexible printed circuit is crimped under uniform pressure over the full face by isotropic pressure of the gas pressure; even if the flexible printed circuit itself varies in thickness, etc., the materials of the plastic films, metal electric circuit, etc., are not strained. With the flexible printed circuit thus manufactured, for the metal electric circuit, the plastic films and adhesive layers of insulation layers vary less in thickness and high-frequency characteristics of relative permittivity (dielectric constant), etc., as a complex of the plastic films and adhesive layers become stable. The above decribed method so as to pressurize under gas pressure is more excellent than the heat press or the like in the following points, that is, it is hardness to put traces caused by minute dust, foreign material, etc., and has the effect of leading to enhancement of quality, performance, etc.

The relative permittivity of the flexible printed circuit manufactured by the above-described method (ratio of permittivity of measured substance to permittivity in vacuum) can be evaluated by the following method: It can be measured by a method defined in JIS C6481. When the relative permittivity of each of the plastic films and adhesive layers is measured separately, the relative permittivity as a complex of the plastic films and adhesive layers generally is found by the following expression (5):

$$\epsilon = \frac{(d_1 + d_2)\epsilon_1\epsilon_2}{d_1\epsilon_2 + d_2\epsilon_1} \tag{5}$$

where d1 and ε1 are thickness and relative permittivity of the plastic film and d2 and ε2 are those of the adhesive layer.

In the crimping in the autoclave described above, various gases, such as nitrogen gas, argon gas, helium gas, and air (atmosphere), are used as gases introduced into the autoclave; particularly nitrogen gas is preferred from standpoints of safety, costs, and easily providing a high pressure by vaporizing liquid because it has a relatively high boiling point and is available as liquid. As conditions for crimping, the pressure condition normally is 1 to 30 kg/cm² and preferably about 5 to 20 kg/cm² and the temperature condition normally is 40° C. to 300° C. and preferably about 50° C. to 200° C.

Figure 26A:
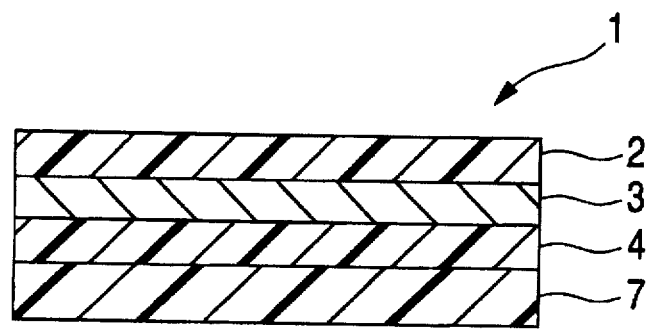
FIG. 26A is a sectional view to show the structure of a flexible printed circuit on which a reinforcing film is stuck and 26B is a sectional view to show the structure of a flexible printed circuit comprising an adhesive layer formed on the surface of each of plastic films on which a reinforcing plastic film is stuck.
Figure 26B:
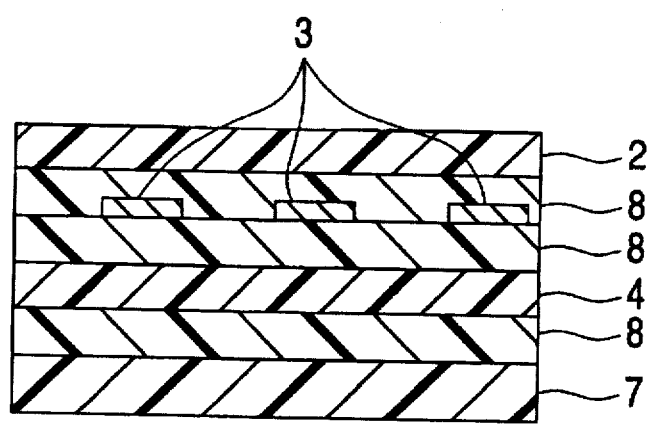
Figure 27:
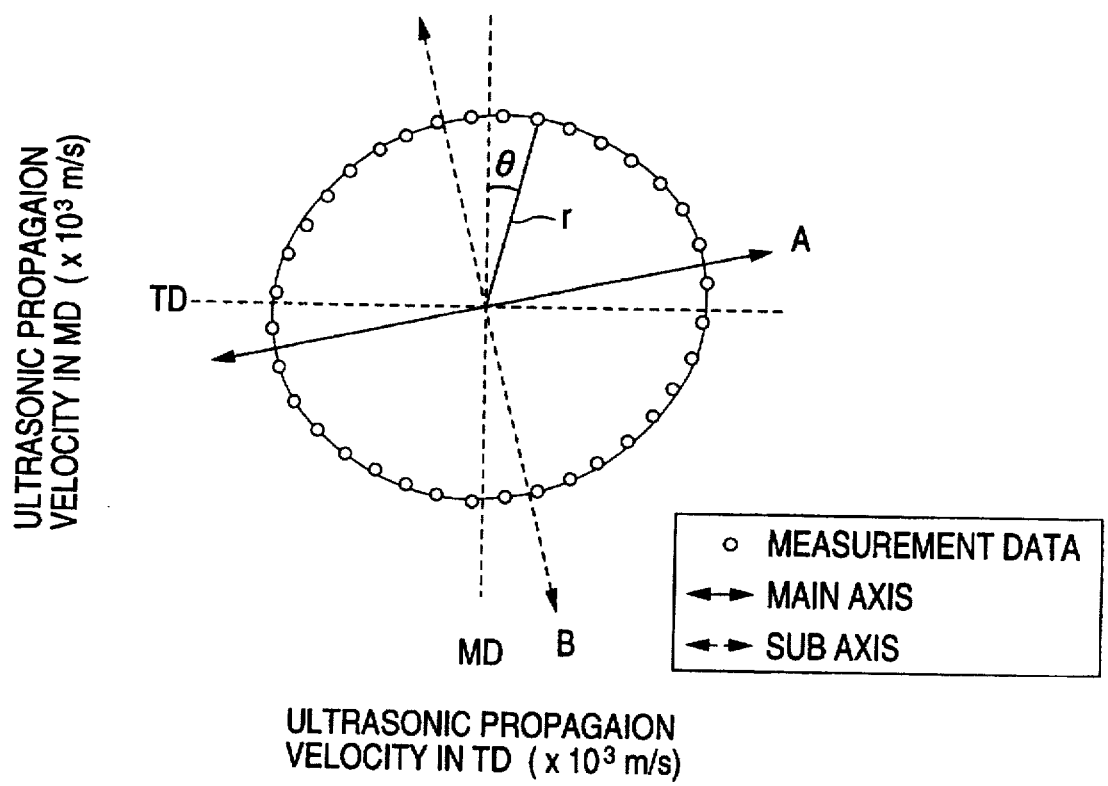
FIG. 27 is a polar coordinate plot chart representing a ultrasonic propagation velocity ellipse of a bidirectionally stretched plastic films.
Figure 28:
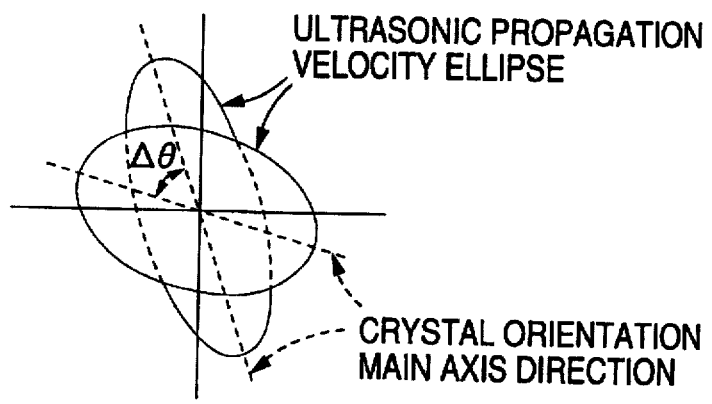
FIG. 28 is a polar coordinate plot chart of overlapping two ultrasonic propagation velocity ellipses.
Figure 29:
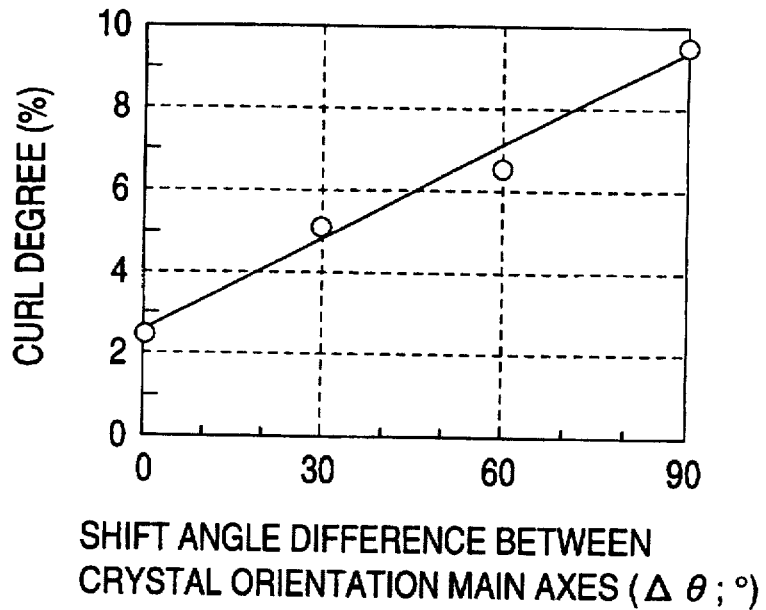
FIG. 29 is a graph to show the relationship between shift angle difference between crystal orientation main axes ($\Delta\theta$) and curl degree (%)
Figure 35:
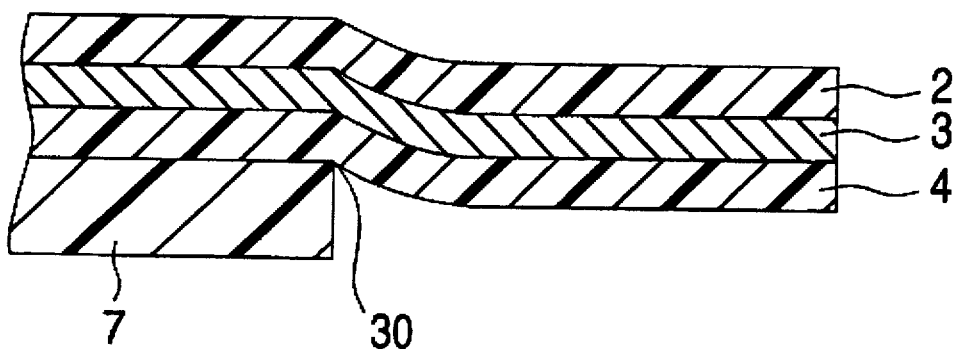
FIG. 35 is an illustration to show a state when a flexible printed circuit on which a reinforcing plastic film is stuck is crimped by a heat press.

On the other hand, a flexible printed circuit on which a reinforcing plastic film is stuck is manufactured as follows:

First, as described above, an adhesive layer 8 is formed on the surface of a plastic film 4 for a base layer and metal electric circuit 3 like that mentioned above is formed on the adhesive layer 8. Next, a plastic film 2 for a cover layer is prepared and an adhesive layer 8 is formed on the surface of the plastic film 2 (see FIG. 18C). On the other hand, a reinforcing plastic film 7 formed on the surface with an adhesive layer 8 is prepared and the plastic film 4 for the base layer and the plastic film 2 for the cover layer are stacked on the top of the reinforcing plastic film 7. Next, in stacked relation, they are crimped by the heat press method or roll laminate method as described above, providing a flexible printed circuit on which the reinforcing plastic film is stuck, as shown in FIG. 26B. When the flexible printed circuit on which the reinforcing plastic film is stuck is thus manufactured, if the lamination is temporarily crimped by the roll laminate method and then pressurized under gas pressure in an autoclave and crimped, particularly an excessive load imposed on the materials is reduced. That is, to stick a reinforcing plastic film by the heat press method, stress concentration occurs on the flexible printed circuit itself at an end 30 of the reinforcing plastic film 7, as shown in FIG. 35, and metal electric circuit is easily broken, damaged, etc. However, if the lamination is pressurized under gas pressure in the autoclave, defects as described above are removed and good properties of enhancement of durability, etc., can be provided.

The measurement method of the coefficient of linear expansion of a plastic film or reinforcing plastic film is a direct measurement method by TMA or a ultrasonic propagation velocity measurement method with SST, as described above. Particularly, the method using the ultrasonic propagation velocities takes an extremely short measurement time of about two minutes as compared with the TMA method, is substantially at the same level of measurement accuracy as the TMA method, and has the advantage of no skill required. The measurement temperature in SST measurement is about 23° C.±2° C.

The above-mentioned linear expansion coefficient difference (Δα) can be derived as follows: First, a linear expansion coefficient ellipse for a plastic film is created by polar coordinate plotting according to the procedure described above (see FIG. 1). The radius of the ellipse, r, can be represented as a function of linear expansion coefficient measurement angle θ (rad), as in Expression (6) below. In Expression (6), ξ denotes an eccentricity and is defined by Expression (7) below, a is the long-axis radius of the ellipse and becomes the maximum value of r (rmax). On the other hand, b is the short-axis radius of the ellipse and becomes the minimum value of r (rmin).

$$r = r(\theta) = \sqrt{\frac{b^2}{1 - \xi^2 \cos^2\theta}} \quad (6)$$

$$\xi = \frac{\sqrt{a^2 - b^2}}{a} \quad (7)$$

where a: long-axis radius of ellipse (maximum value of r; rmax)

b: short-axis radius of ellipse (minimum value of r; rmin)

Assuming that the radiuses of ellipses for two plastic films 2 and 4 positioned on both outermost layers are r1 and r2, the linear expansion coefficient difference (^α) can be represented by the following expression (8):

$$\Delta\alpha = |\Delta\alpha(\theta)| = |r_1(\theta) - r_2(\theta)| \quad (8)$$

According to Expression (8), comparison is made over 0 to 360 degrees (0 to 2 πrad) with respect to the measurement angle θ and the maximum value is the maximum value (^αmax) of the linear expansion coefficient difference (^α) between the two plastic films. The maximum value (Δαmax) can also be derived by using a computer with Expressions (6), (7), and (8) programmed.

On the other hand, the total area (C) of portions where the ellipses do not overlap can be derived, for example, according to cumulative expression (9), which is one of approximate expressions of Expression (2) for defining the area (C). Approximating of Expression (2) by other expressions is not limited.

$$C \approx 1/2 \sum_{n=1}^{m} \left[ \frac{\Delta\alpha c(n \times \Delta\theta) + \Delta\alpha c\{(n-1) \times \Delta\theta\}}{2} \right] \Delta\theta \quad (9)$$

where m=(2π/Δθ)

To use cumulative expression (9), normally m takes 120 to 2880 values and preferably 360 to 1080 values, and Δθ=2π/m.

In selection of the plastic films, the most basic method is to measure the coefficient of linear expansion for each plastic film and execute polar coordinate plotting for creating a linear expansion coefficient ellipse to check whether or not the conditions are satisfied; but it lacks practicality. Then, to solve this problem, the present inventor et al. examined linear expansion coefficient characteristics at points of a raw material film of plastic films and found out that there is given regularity in the film width direction (transverse direction of stretch).

Figure 3:
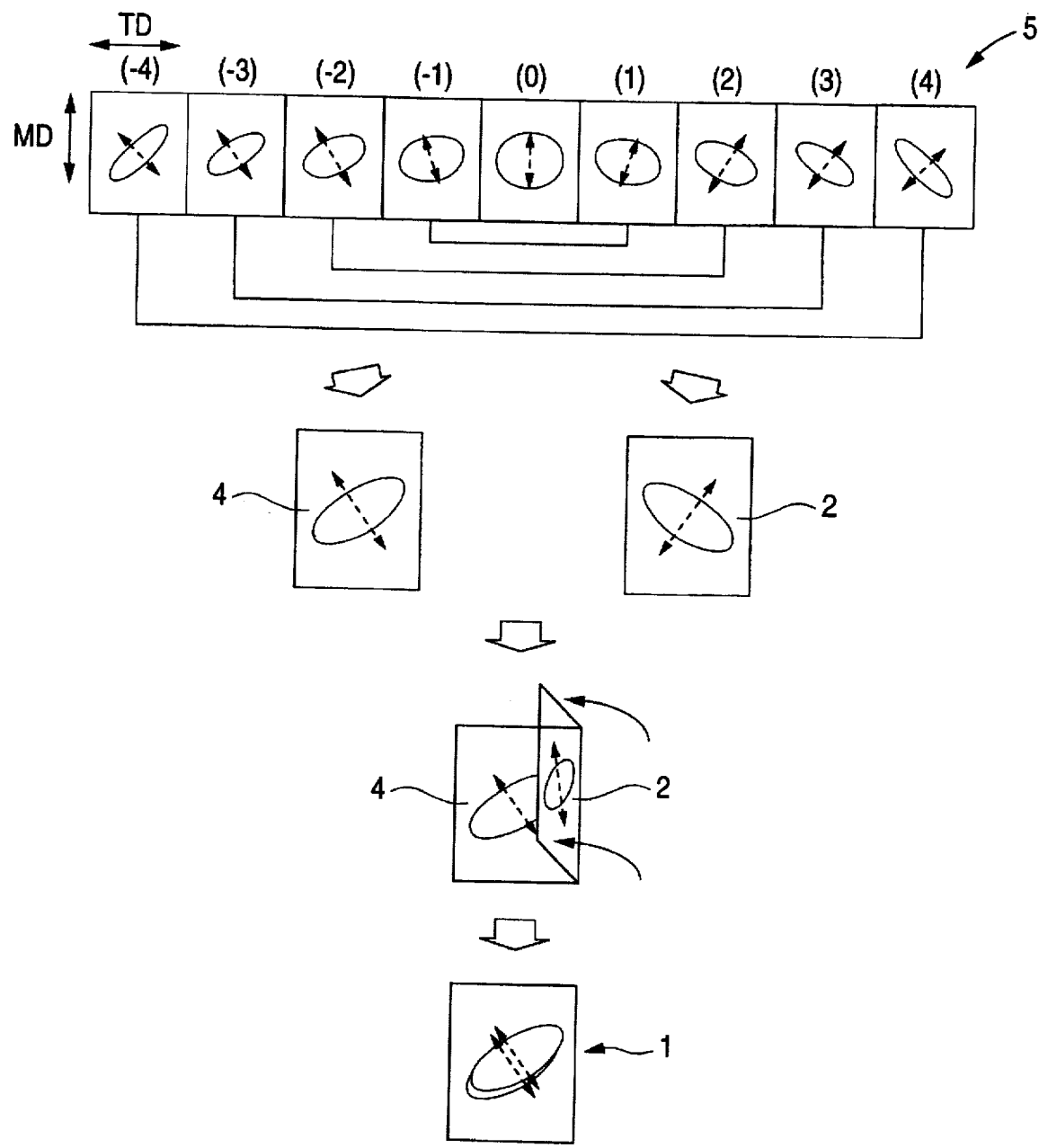
FIG. 3 is a schematic diagram to show linear expansion coefficient ellipses in parts in the width direction of a bidirectionally stretched plastic film.
Figure 4:
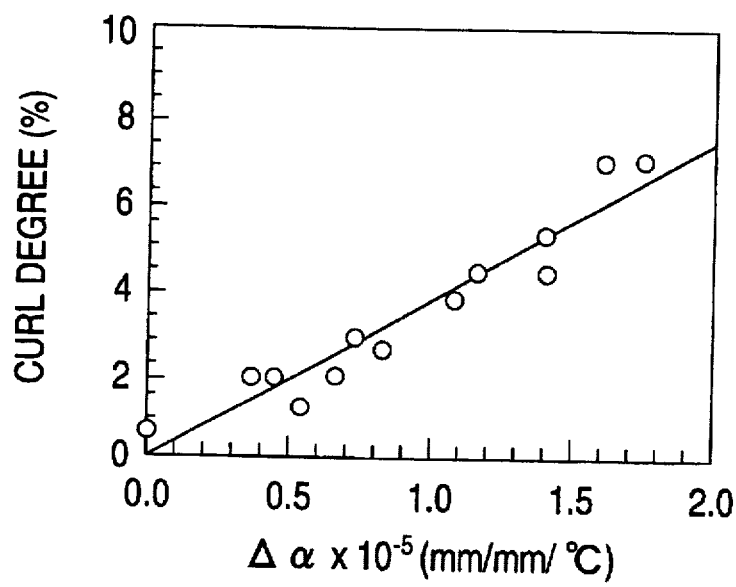
FIG. 4 is a graph to show the relationship between the maximum values of linear expansion coefficient differences and curl degrees.
Figure 5:
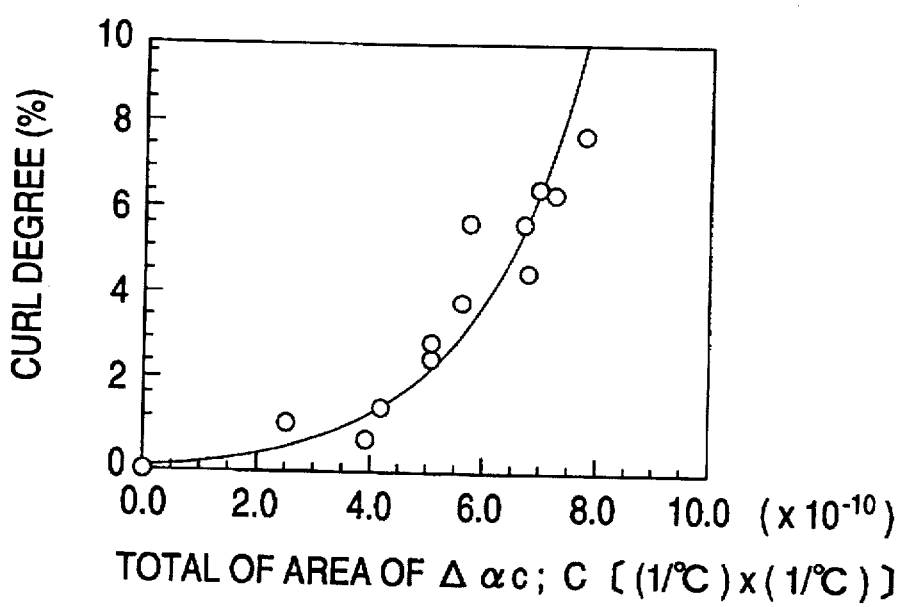
FIG. 5 is a graph to show the relationship between the integral values of linear expansion coefficient square value differences ($\Delta\alpha c$) and curl degrees.

FIG. 3 shows linear expansion coefficient characteristics in the width direction of a raw material film 5 bidirectionally stretched. In the figure, the raw material film 5 is divided into nine parts in the width direction thereof and the parts are represented by relative positions (−4,−3, −2, −1, 0, 1, 2, 3, and 4) with the center as the reference (0). Linear expansion coefficient ellipses are shown in the parts and crystal orientation main axes are indicated by dotted line arrows. MD denotes the machine direction of stretch and TD denotes the transverse direction of stretch. As shown in FIG. 3, the crystal orientation main axis and the machine direction of stretch match at the center of the raw material film 5 and as the part of the raw material film 5 deviates from the center, its corresponding crystal orientation main axis shifts from the machine direction of stretch (the corresponding dotted line arrow is inclined with respect to the MD direction). The point to be noted is that the crystal orientation main axes shift from the machine direction of stretch symmetrically.

Specifically, in FIG. 3, the crystal orientation main axes in the parts at relative positions (1) and (−1), (2) and (−2), (3) and (−3), and (4) and (−4) are symmetrical. Using the fact, minus (−) relative positions are used for cover layers (C/L) and plus (+) relative positions are used for base layers (B/S). As shown in the figure, when symmetrical parts (relative positions) are extracted and laminated with their surfaces facing each other, the crystal orientation main axes substantially match and the maximum value of the linear expansion coefficient difference (^α) and the total area (C) of portions where the ellipses do not overlap fall below the predetermined values.

On the other hand, as a second method, a raw material plastic film is divided into two parts (a cover layer cut portion and a base layer cut portion) in parallel with the length direction of the plastic film, from which cover and base layer plastic films are cut out in parallel with the length direction and the cover and base layer plastic films having a relationship satisfying at least one of the two conditions are placed on both the outermost layers of the plastic film laminate.

Figure 36:
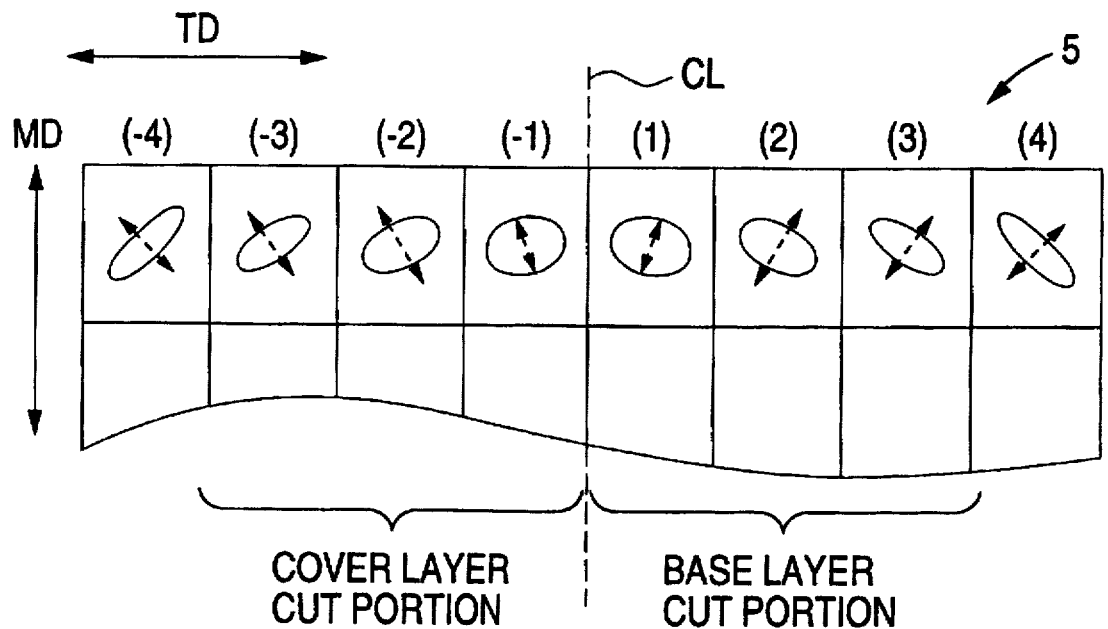
FIG. 36 is a schematic diagram to show linear expansion coefficient ellipses in parts in the width direction of a bidirectionally stretched plastic film.
Figure 36:
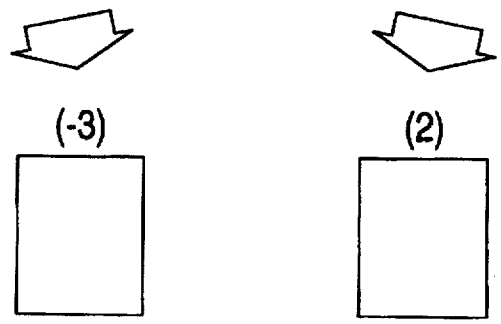
Figure 36:
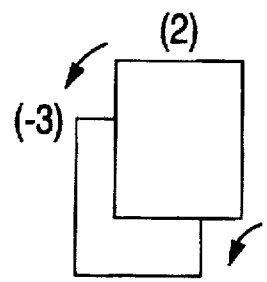

FIG. 36 shows coefficient of linear expansion characteristics as similar to FIG. 3. In FIG. 36, the raw material film 5 is divided into eight parts and the parts are represented by relative positions (−4, −3, −2, −1, 1, 2, 3 and 4) with the center as a center line CL. The relative linear expansion coefficient difference is not so large in the adjacent portion (−3, −2, −1, 1, 2 and 3) of the center line CL of the raw material film 5. As shown in FIG. 36, relative positions (−3) to (−1) are used for the cover layer cut portion and relative positions (1) to (3) are used for the base layer cut portion. In the case that two layers which is selected out from the above are positioned on the outer most layers and the flexible printed circuit is made, the occurence of curling is prevented. In FIG. 36, a plastic film for cover layer cut out from the relative position (−3) and a plastic film for base layer cut out from the relative position (2) are laminated.

Dividing of the raw material plastic film is shown as an example; in fact, it is determined appropriately by the size, stretch degree, etc., of the raw material plastic film. For example, for a raw material plastic film 2 to 6 m wide, if the division width (band width) is set to 200 to 1000 mm, the number of divisions becomes six to ten. Specifically, for example, if the raw material plastic film is 2 m wide, it can be divided into 10 parts (divisions) with the division width (band width) set to 200 mm. If the raw material plastic film is 6 m wide, it can be divided into six parts (divisions) with the division width (band width) set to 1000 mm. For example, if the raw material plastic film is 5 m wide, preferably it can be divided into 10 parts (divisions) with the division width (band width) set to 500 mm for the reason of good workability.

Therefore, the linear expansion coefficient ellipses of the parts of a raw material film are previously examined, the linear expansion coefficient characteristics are grasped and standardized, predetermined parts of the raw material film are extracted, and the parts with the linear expansion coefficient ellipses substantially symmetric are combined. In doing so, the maximum value of the linear expansion coefficient difference and the total area of portions where the ellipses do not overlap can be set to predetermined values or less without creating linear expansion coefficient ellipses each time a plastic film is selected. As a result, the production efficiency of flexible printed circuits with curl occurrence suppressed can be improved.

Which of the first and second methods is selected for manufacturing flexible printed circuits is determined appropriately by manufacturing conditions, etc. That is, the second method is excellent as compared with the first method from the viewpoint of the manufacturing efficiency; the latter is excellent as compared with the former from the viewpoint of curl occurrence prevention. Therefore, considering the points, either of the two methods can be selected depending on which of the manufacturing efficiency and curl occurrence prevention takes precedence.

The two plastic films positioned on both the outermost layers of plastic film laminates are laminated on each other with their surfaces facing each other, whereby there are provided advantages of enhancing the adhesion strength and eliminating the need for considering the difference between the surface and rear face of the flexible printed circuit. That is, the surface and rear face of a plastic film cut out from a raw material plastic film stretched in two directions differ plainly in surface (rear face) state of wet property, coarseness, etc. Therefore, if two plastic films are placed on both the outermost layers in a state in which the same surfaces face each other, the rear faces of the two plastic films exist on the surface and rear face of the flexible printed circuit and the surface and rear face of the flexible printed circuit become the same state. This eliminates the need for considering the difference between the surface and rear face to apply various treatments to the flexible printed circuit. Specifically, for example, it becomes less necessary to take notice of the difference between the surface and rear face of the flexible printed circuit in characteristics such as printability on the flexible printed circuit, wear resistance, sliding property, intimate contact with a reinforcing plate, and close adherence of electromagnetic wave shielding paint, and work efficiency when treatments are applied to the flexible printed circuit and efficiency of a mounting process, etc., of electronic parts, etc., can be improved.

In a flexible printed circuit on which a reinforcing plastic film is stuck, normally, separate raw material films are used for the reinforcing plastic film and other plastic films. Thus, the above-described method cannot be applied to flexible printed circuits on which a reinforcing plastic film is stuck. Even in this case, however, if ultrasonic propagation velocities of plastic films are measured with SST and linear expansion coefficient characteristic differences are controlled by a method of using the shift angle difference (Δθ) between the crystal orientation main axes of ellipses, the time required for measurement is extremely short and no skill is required, thus predetermined production efficiency can be maintained.

The two plastic films positioned on both the outermost layers of plastic film laminates are laminated on each other with their surfaces facing each other, whereby there are provided advantages of enhancing the adhesion strength and eliminating the need for considering the difference between the surface and rear face of the flexible printed circuit, as described above. Specifically, for example, it becomes less necessary to take notice of the difference between the surface and rear face of the flexible printed circuit in characteristics such as printability on the flexible printed circuit, wear resistance, sliding property, intimate contact with a reinforcing plate, and close adherence of electromagnetic wave shielding paint, and work efficiency when treatments are applied to the flexible printed circuit and efficiency of a mounting process, etc., of electronic parts, etc., can be improved.

We have discussed the flexible printed circuits of the invention by taking those with two plastic films laminated and those with two plastic films laminated on which a reinforcing plastic film is stuck as examples. However, the invention is not limited to them and can also be applied to those with three or more plastic films laminated in addition to a reinforcing plastic film. As described above, in this case, only two plastic films positioned on both the outermost layers of plastic film laminates making up the flexible printed circuit need satisfy the predetermined conditions of the invention, and the plastic film positioned on an intermediate layer need not be considered. That is, in the flexible printed circuit on which a reinforcing plastic film is stuck, both the outermost layers which need to satisfy the predetermined conditions of the invention are a plastic film on the side on which the reinforcing plastic film is not stuck and the reinforcing plastic film; a plastic film positioned therebetween need not be considered.

Figure 14:
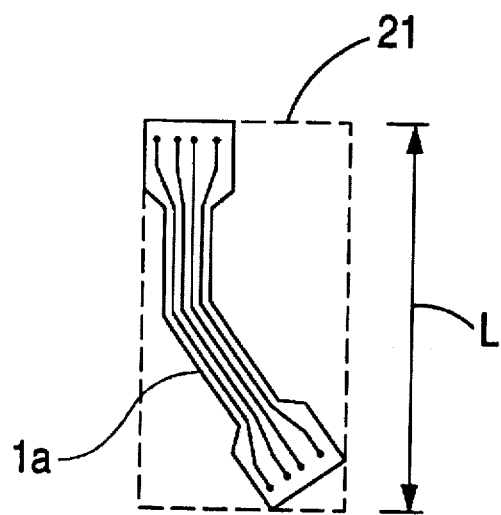
FIG. 14 is a plan view to show a flexible printed circuit formed like substantial V-shape.
Figure 15:
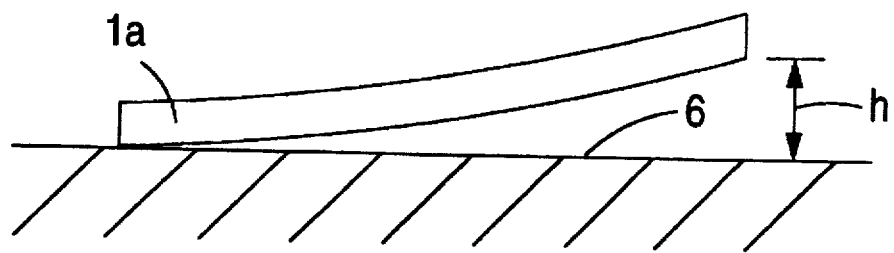
FIG. 15 is an illustration of curl amount measurement of a flexible printed circuit.

The thickness of the flexible printed circuit according to the invention is determined appropriately by applications, etc., of the flexible printed circuit, but generally set to 50 to 800 μm and preferably 100 to 600 μm. The shape of the flexible printed circuit is not limited either; for example, the flexible printed circuit is formed as shapes responsive to various applications in addition to substantial ?? shape shown in FIG. 14. The size of the flexible printed circuit is not limited either; for example, the flexible printed circuit may have the above-mentioned longest length L in the range of 10 to 1000 mm and preferably in the range of 30 to 600 mm.

Figure 24:
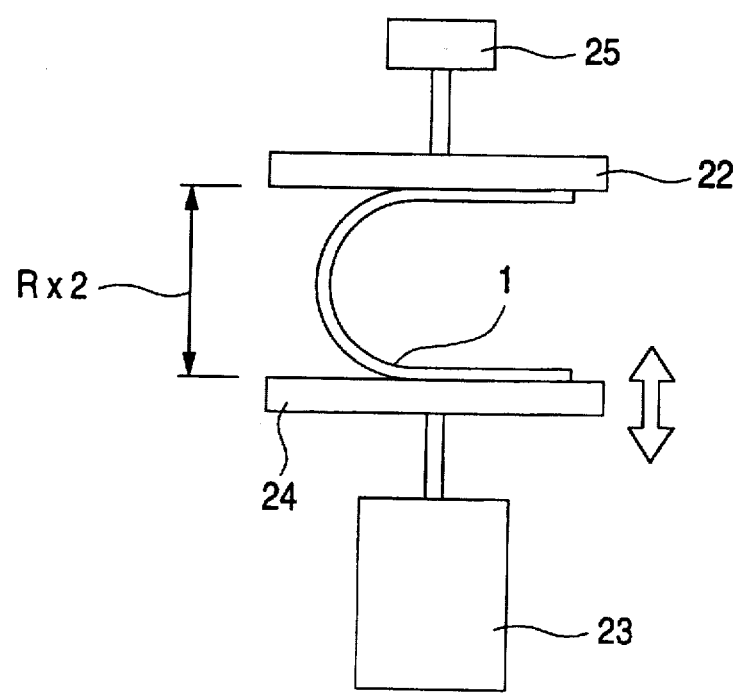
FIG. 24 is an illustration to show a measuring instrument of flexibility of flexible printed circuits.

Flexibility of the flexible printed circuits according to the invention is measured with a compression tester as shown in FIG. 24, for example. In the figure, numeral 22 is an upper fixed plate above which a load cell (load detector) 25 is disposed, and a lower moving plate 24 that can move up and down in conjunction with a drive section (linear motor) 23 is disposed so as to face the lower side of the upper fixed plate 22. First, a flexible printed circuit 1 is placed between the upper fixed plate 22 and the lower moving plate 24 in a state in which it is bent like a U-shape in horizontal orientation in a long-side direction. Next, the drive section 23 is actuated for causing the lower moving plate 24 to rise for compressing the bent flexible printed circuit 1 sandwiched between the lower moving plate 24 and the upper fixed plate 22. When the bent flexible printed circuit 1 is compressed a given amount to a predetermined bend radius R, a repulsion force detected by the load cell 25 is measured and flexibility (repulsion force) is calculated from the expression (10) shown below for evaluation. Since the distance between the upper fixed plate 22 and the lower moving plate 24 at the measurement time becomes double the bend radius R of the flexible printed circuit 1, the bend radius R can be calculated from the distance.

Repulsion force (kg/cm)=repulsion force detection value (g)/length of short side (width) of flexible printed circuit (cm)   (10)

The flexibility of the flexible printed circuit thus measured normally is in the range of repulsion force=2 g/cm when bend radius R=5 mm to repulsion force=600 g/cm when bend radius R=15 mm and preferably in the range of repulsion force=4 g/cm when bend radius R=5 mm to repulsion force=400 g/cm when bend radius R=15 mm regardless of whether or not a reinforcing plastic film is stuck on the flexible printed circuit.

Figure 25:
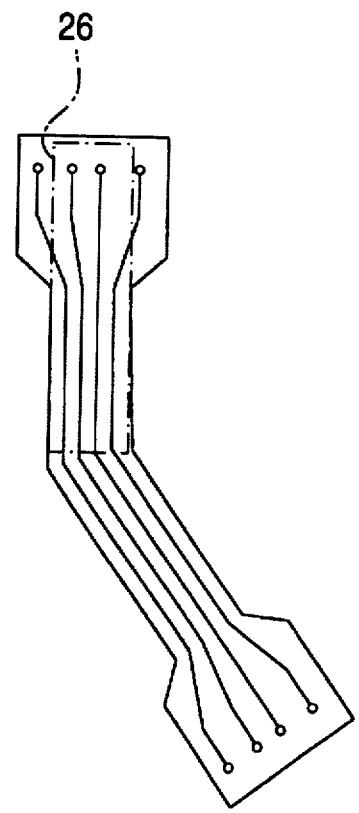
FIG. 25 a plan view to show a flexible printed circuit formed like substantial V-shape.

The flexibility evaluation method is applied to rectangular flexible printed circuits, but can also be applied to flexible printed circuits of any other shape than a rectangle. For example, for a flexible printed circuit 1a shaped like substantially V-shaped as shown in FIG. 25, a predetermined rectangle (for example, maximum rectangle 26 indicated by the chain line involved in the flexible printed circuit 1a substantially V-shaped shown in FIG. 25) is previously cut out from the flexible printed circuit and the flexibility of this sample is evaluated by the above-described method, then cutting to the predetermined substantial shape may be performed. In this case, if the shape and size of samples for measurement are standardized, the flexibility can be evaluated objectively.

As we have discussed, for the flexible printed circuit of the invention, when linear expansion coefficient ellipses representing the linear expansion coefficient characteristics of the plastic films positioned on both the outermost layers, of laminated plastic films making up the flexible printed circuit are created and overlapped, the maximum value of the linear expansion coefficient difference and the total area of portions where the ellipses do not overlap are set to predetermined values or less. Resultantly, curl occurrence of the flexible printed circuit of the invention is suppressed. Therefore, the flexible printed circuit of the invention is high in accuracy of the shape; if it is used to mount electronic parts, the electronic parts can be mounted with high accuracy even in automatic mounting by a machine.

In the flexible printed circuit of the invention, the plastic films positioned on both the outermost layers, of laminated plastic films making up the flexible printed circuit are placed in a state in which their surfaces face each other, the surface and rear face of the flexible printed circuit becomes the same state and the need for considering the difference therebetween is eliminated. Resultantly, the advantages such as enhancing the work efficiency when various treatments are applied to the flexible printed circuit or electronic parts, etc., are mounted thereon can be provided.

Further, in the flexible printed circuit of the invention, if metal electric circuit is formed in at least one of two or more laminated plastic films and the product of the thickness and tensile modulus of the metal electric circuit (K) is set to 500 kg/mm or less, sufficient flexibility of the flexible printed circuit is provided and curl occurrence thereof is also suppressed, providing a high-performance flexible printed circuit. Therefore, for example, the flexible printed circuit becomes suitable for frequently bent places such as a connection part of a print head and a mother board of a printer.

Moreover, in the invention, in a flexible printed circuit on which a reinforcing plastic film is stuck, if the linear expansion characteristic difference between a plastic film of laminated plastic films on the side where the reinforcing plastic film is not stuck and the reinforcing plastic film is controlled using a predetermined index, curl occurrence is suppressed even for the flexible printed circuit of an asymmetric structure on which the reinforcing plastic film is stuck.

The fact that there is given regularity about coefficients of linear expansion in the transverse direction of an stretched raw material plastic film is used to previously select parts of the raw material plastic film from which plastic films are to be cut out, or combine plastic films so that the cut parts becomes substantially symmetric. In doing so, two plastic films can be placed on both the outermost layers so as to satisfy at least one of the above conditions without measuring the coefficient of linear expansion for each plastic film or the ultrasonic propagation velocity. This results in prevention of curl occurrence and enhancement of the manufacturing efficiency of flexible printed circuits.

Further, in the flexible printed circuit of the invention, if a plurality of plastic films stacked via an adhesive layer are temporarily crimped by the roll laminate method in stacked relation and then pressurized under gas pressure in an autoclave and crimped, the flexible printed circuit is crimped under uniform pressure on the full face by isotropic pressure produced by the gas pressure, thus no excessive force is applied to parts of the materials of the plastic films, metal electric circuit, etc., and the quality and performance of the finally provided product become good.

Next, embodiments will be discussed together with comparisons.

EMBODIMENT 1

Figure 6:
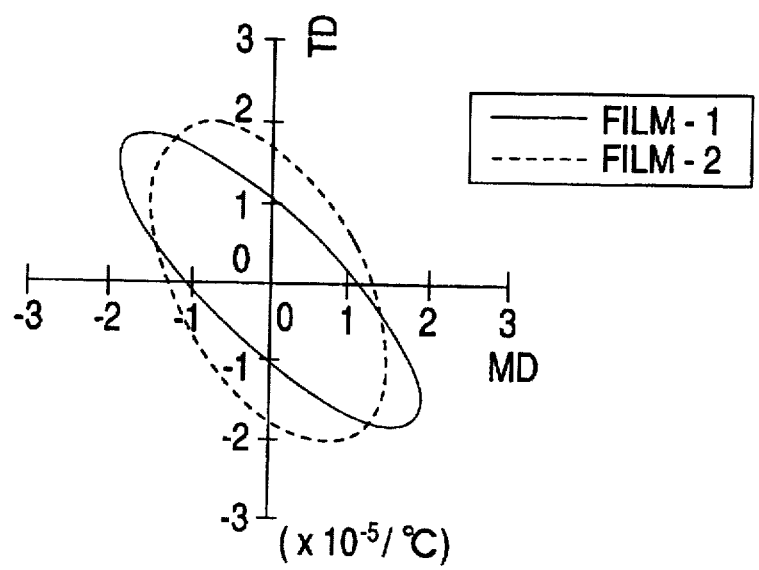
FIG. 6 is a polar coordinate plot chart of overlapping two linear expansion coefficient ellipses in Embodiment 1.

A bidirectionally stretched polyethylene terephthalate film 0.05 mm thick (manufactured by TORAY) was used a raw material film, from which plastic films (film-1 and film-2) each having a size of 100×200 mm were cut out. Linear expansion coefficients were measured by the above-described TMA method and linear expansion coefficient ellipses were created by polar coordinate plotting and were overlapped. These overlapped ellipses are shown in a graph of FIG. 6. From this graph, the maximum value of the linear expansion coefficient difference between film-1 and film 2 ($\Delta\alpha$) was calculated by using a control computer attached to TMA programmed based on ] Expressions (6), (7), and (8) described above. The result was $0.53 \times 10^{-5}$ (1/°C.), which was equal to or less than a predetermined value. The linear expansion coefficient measurement by TMA was executed to exclude the effects of hygroscopic expansion and heat shrinkage as follows: The plastic films were left standing for 60 minutes at 150° C. for drying, then while the plastic films were cooled from 150° C. to 30° C., the plastic film length and temperature were measured simultaneously and consecutively, and linear expansion coefficients were found based on Expression (1) for regions of Tg or less.

Next, a polyester family thermosetting adhesive was applied to the surface of film-1, then dried to form an adhesive layer 0.03 mm thick. Film-1 and film-2 were laminated by crimping by a heat press (conditions: 150×1 h×30 kg/cm$^2$) with the surfaces of film-1 and film-2 facing each other. The curl amount h of the plastic film laminate was measured by the above-described method. As a result, the curl amount h was 4.2 mm and the curl degree was 2.1%; curl occurrence was suppressed.

On the other hand, aside from the plastic film laminate, a flexible printed circuit formed with metal electric circuit was manufactured as shown in FIG. 18. That is, first the same film-1 and film-2 as described above were prepared. As shown in FIG. 18A to 18D, an adhesive layer was formed on the surface of film-2 (for a base layer) as described above. Copper foil 3a 0.018 mm thick was placed on the adhesive layer 8 and they were bonded by the roll laminate method (surface temperature was set to 120° C.). Next, as shown in FIG. 18B, the copper foil was etched by the subtractive method to form metal electric circuit 3. On the other hand, an adhesive layer was formed on the surface of film-1 (for a cover layer) as described above. As shown in FIG. 18C, film-1 and film-2 were laminated by crimping by a heat press (conditions: 150° C.×1 h×30 kg/cm$^2$) with the surfaces of film-1 and film-2 facing each other, manufacturing a flexible printed circuit as shown in FIG. 18D.

For the flexible printed circuit, the curl amount h was measured as described above. As a result, the curl amount h was 3.9 mm and the curl degree was 2.0%; curl occurrence was suppressed.

COMPARISON 1

Figure 7:
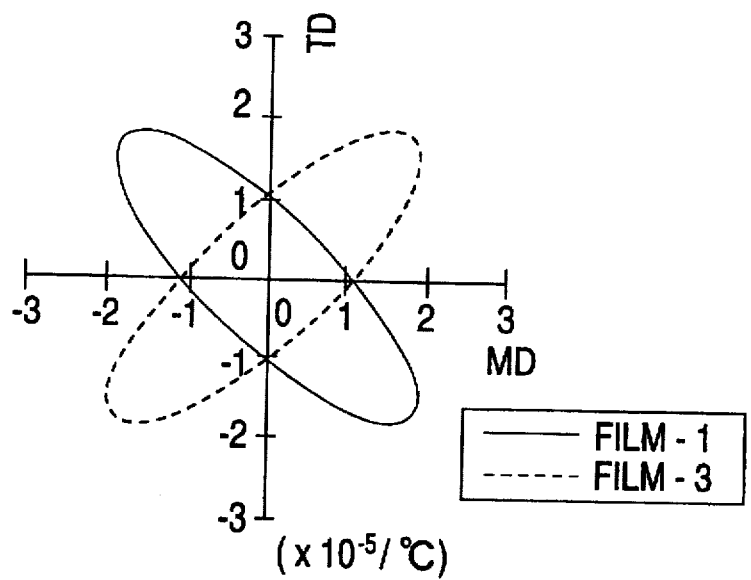
FIG. 7 is a polar coordinate plot chart of overlapping two linear expansion coefficient ellipses in Comparison 1.

A new plastic film (film-3) having a size of 100×200 mm was cut out from the polyethylene terephthalate film used with Embodiment 1. On the other hand, the same film-1 as in Embodiment 1 was prepared. Linear expansion coefficient ellipses were created and overlapped as in Embodiment 1. These overlapped ellipses are shown in a graph of FIG. 7. From this graph, the maximum value of the linear expansion coefficient difference between film-1 and film-3 ($\Delta\alpha$) was calculated. The result was $1.77\times10^{-5}$ (1/°C.), which exceeded a predetermined value.

A plastic film laminate of film-1 and film-3 was created as in Embodiment 1. The curl amount h of the plastic film laminate was measured as in Embodiment 1. As a result, the curl amount h was 14.0 mm and the curl degree was 7.0%; a curl occurred.

On the other hand, aside from the plastic film laminate, a flexible printed circuit formed with metal electric circuit was manufactured. That is, the same film-1 (for a cover layer) and film-3 (for a base layer) as described above were prepared. An adhesive layer was formed on the surface of film-3 as in Embodiment 1, then electric circuit was formed by the subtractive method and an adhesive layer was formed on the surface of film-1. In a similar manner to that described above, film-1 and film-3 were laminated to manufacture a flexible printed circuit. For this flexible printed circuit, the curl amount h was measured as described above. As a result, the curl amount h was 13.5 mm and the curl degree was 6.8%; a curl occurred.

EMBODIMENT 2

Figure 8:
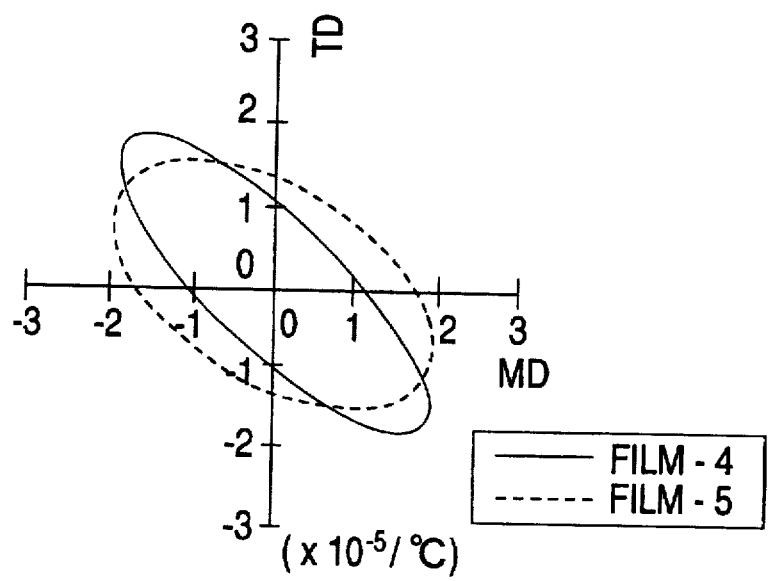
FIG. 8 is a polar coordinate plot chart of overlapping two linear expansion coefficient ellipses in Embodiment 2.

A bidirectionally stretched polyimide film 0.125 mm thick (manufactured by TORAY-Dupont) was used a raw material film, from which plastic films (film-4 and film-5) each having a size of 200×360 mm were cut out. Linear expansion coefficients were measured by the above-described TMA method and linear expansion coefficient ellipses were created by polar coordinate plotting and were overlapped. These overlapped ellipses are shown in a graph of FIG. 8. From this graph, the total area of portions where the ellipses of film-4 and film-5 do not overlap (C) was $3.44\times10^{-10}$ [(1/°C.)×(1/°C.)], which was equal to or less than a predetermined value. The area was calculated by using a control computer attached to a TMA measuring instrument according to cumulative expression (9) described above by setting m=720 and $\Delta\theta=(2\pi/720)\approx0.00873$ (rad).

Next, an epoxy family thermosetting adhesive was applied to the surface of film-4, then dried to form an adhesive layer 0.03 mm thick. Film-4 and film-5 were temporarily crimped by the roll laminate method with the surfaces of film-4 and film-5 facing each other, then cured in an autoclave (conditions: 150° C.×1 h×15 kg/cm$^2$) and laminated. The curl amount h of the plastic film laminate was measured by the above-described method. As a result, the curl amount h was 9.5 mm and the curl degree was 2.6%; curl occurrence was suppressed.

On the other hand, aside from the plastic film laminate, a flexible printed circuit formed with metal electric circuit was manufactured. That is, the same film-4 (for a cover layer) and film-5 (for a base layer) as described above were prepared. An adhesive layer was formed on the surface of film-5 as in Embodiment 1, then copper electric circuit 0.035 mm thick was formed by the subtractive method and an adhesive layer was formed on the surface of film-4. Film-4 and film-5 were laminated as in Embodiment 1, manufacturing a flexible printed circuit. For this flexible printed circuit, the curl amount h was measured as described above. As a result, the curl amount h was 8.3 mm and the curl degree was 2.3%; curl occurrence was suppressed.

COMPARISON 2

Figure 9:
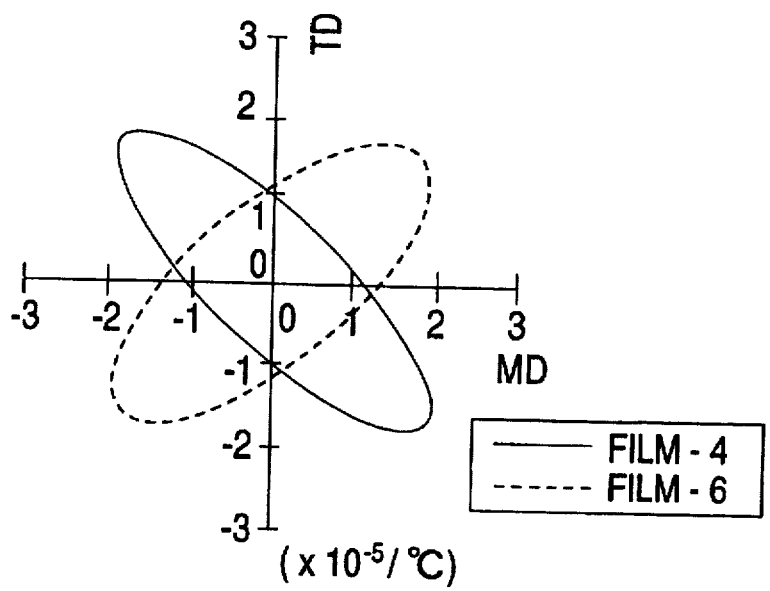
FIG. 9 is a polar coordinate plot chart of overlapping two linear expansion coefficient ellipses in Comparison 2.

A new plastic film (film-6) having a size of 200×360 mm was cut out from the polyimide film used with Embodiment 2. On the other hand, the same film-4 as in Embodiment 2 was prepared. Linear expansion coefficient ellipses were created and overlapped as in Embodiment 2. These overlapped ellipses are shown in a graph of FIG. 9. Based on this graph, the total area of portions where the ellipses of film-4 and film-6 do not overlap (C) was calculated as in Embodiment 2. The result was $7.71\times10^{-10}$ [(1/°C.)×(1/°C.)], which exceeded a predetermined value.

Next, a plastic film laminate of film-4 and film-6 was created as in Embodiment 2. The curl amount h of the plastic film laminate was measured as in Embodiment 2. As a result, the curl amount h was 28.0 mm and the curl degree was 7.8%; a curl occurred.

On the other hand, aside from the plastic film laminate, a flexible printed circuit formed with metal electric circuit was manufactured. That is, the same film-4 (for a cover layer) and film-6 (for a base layer) as described above were prepared. An adhesive layer was formed on the surface of film-6 as in Embodiment 2, then metal electric circuit was formed by the subtractive method and an adhesive layer was formed on the surface of film-4. In a similar manner to that described above, film-4 and film-6 were laminated to manufacture a flexible printed circuit. For this flexible printed circuit, the curl amount h was measured as described above. As a result, the curl amount h was 25.2 mm and the curl degree was 7.0%; a curl occurred.

EMBODIMENT 3

Figure 10:
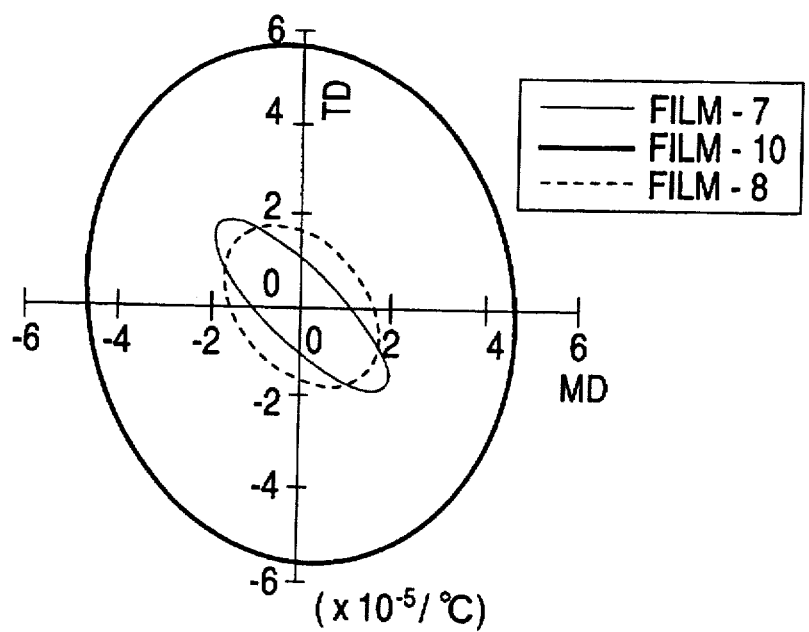
FIG. 10 is a polar coordinate plot chart of overlapping three linear expansion coefficient ellipses in Embodiment 3.

A bidirectionally stretched polyethylene terephthalate film 0.125 mm thick (manufactured by TORAY) was used a raw material film, from which plastic films (film-7 and film-8) each having a size of 200×360 mm were cut out. A bidirectionally stretched polyethylene terephthalate film 0.250 mm thick (manufactured by TORAY) was used a raw material film, from which a plastic film (film-10) having a size of 200×360 mm was cut out. Three linear expansion coefficient ellipses were created as in Embodiment 1 and were overlapped. These overlapped ellipses are shown in a graph of FIG. 10. From this graph, the maximum values of the linear expansion coefficient differences among film-7, film-8, and film-10 were calculated as in Embodiment 1. As a result, the maximum value of the linear expansion coefficient difference between film-7 and film-8 was $0.54\times10^{-5}$ (1/°C.); that between film-7 and film-10 was $4.49\times10^{-5}$ (1/°C.); and that between film-8 and film-10 was $3.94\times10^{-5}$ (1/°C.).

Figure 13:
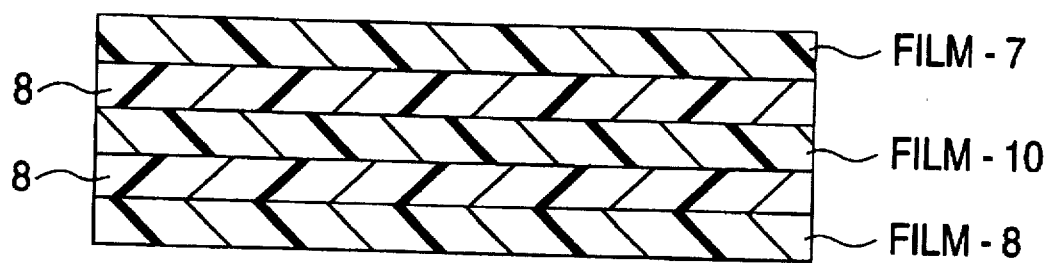
FIG. 13 is a sectional view to show the structure of a flexible printed circuit with three plastic films laminated.

Next, a polyester family thermosetting adhesive shaped like a sheet 0.05 mm thick was prepared and temporarily crimped on the surface and rear face of film-10 with a roll. Next, film-7 and film-8 were placed on the surface and rear face of film-10 and they were temporarily crimped by the roll laminate method, then cured in an autoclave (conditions: 110° C.×2 h×10 kg/cm$^2$) for manufacturing a plastic film laminate of a 3-layer structure as shown in FIG. 13. In the figure, numeral 8 denotes an adhesive layer. Positioned on the outermost layers of the plastic film laminate are film-7 and film-8. As described above, the maximum value of the linear expansion coefficient difference between film-7 and film-8 is $0.54\times10^{-5}$ (1/°C.), which is equal to or less than the predetermined value of the invention. The curl amount h of the plastic film laminate was measured by the above-described method. As a result, the curl amount h was 5.4 mm and the curl degree was 1.5%; curl occurrence was suppressed.

Figure 19:
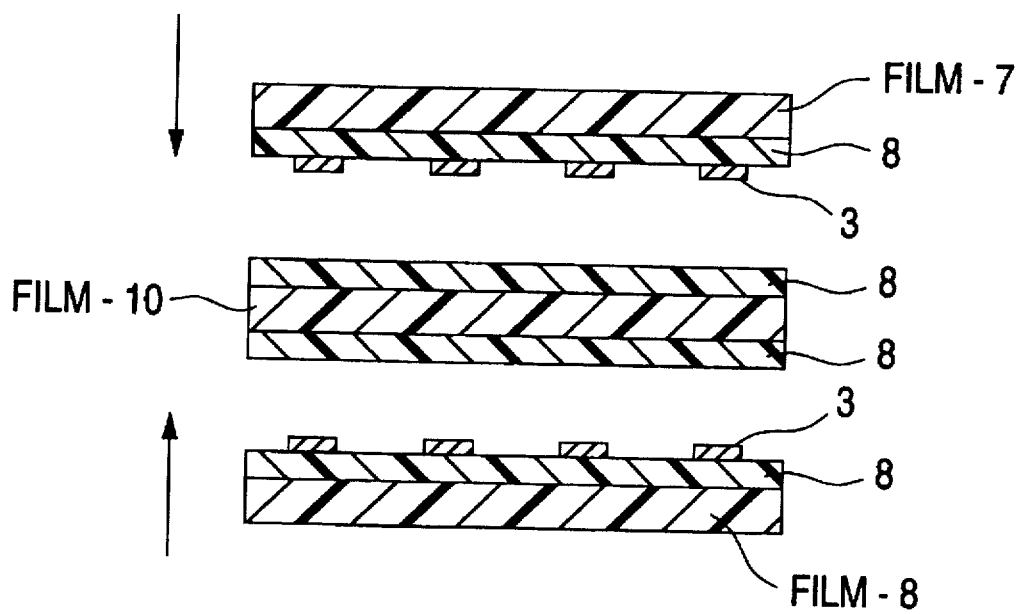
FIG. 19 is a sectional view to show a state of manufacturing a flexible printed circuit of a 3-film-layer structure.
Figure 20:
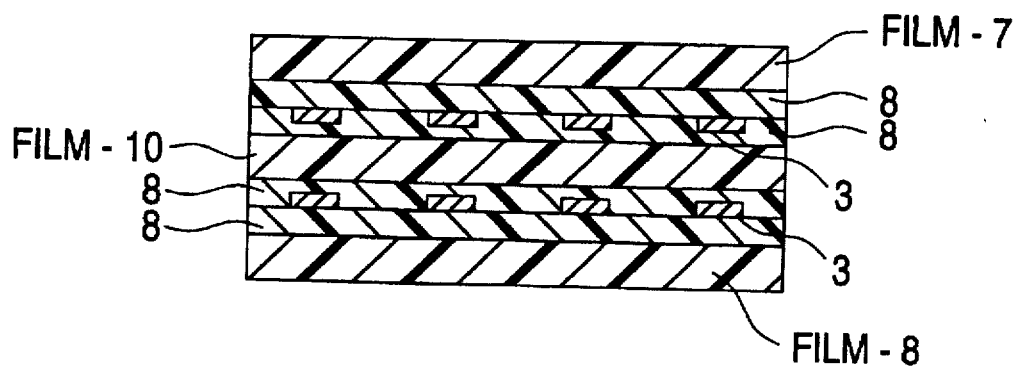
FIG. 20 is a sectional View to show the structure of a flexible printed circuit of a 3-film-layer structure.
Figure 21:
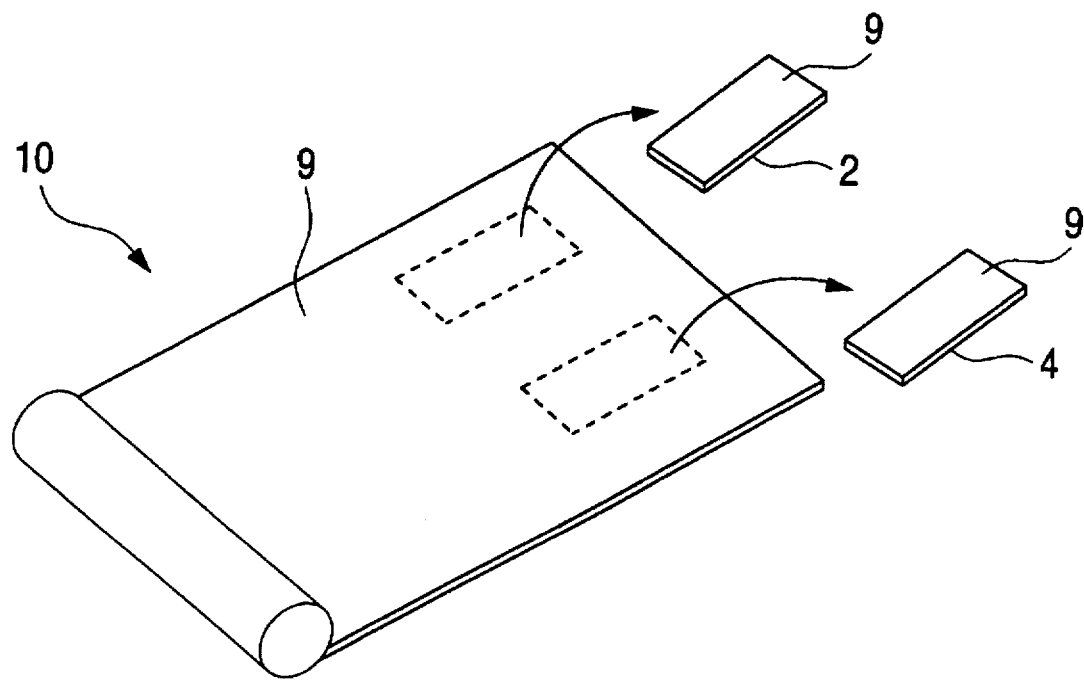
FIG. 21 is an illustration to show a state of cutting out plastic films from a raw material film.
Figure 22A:
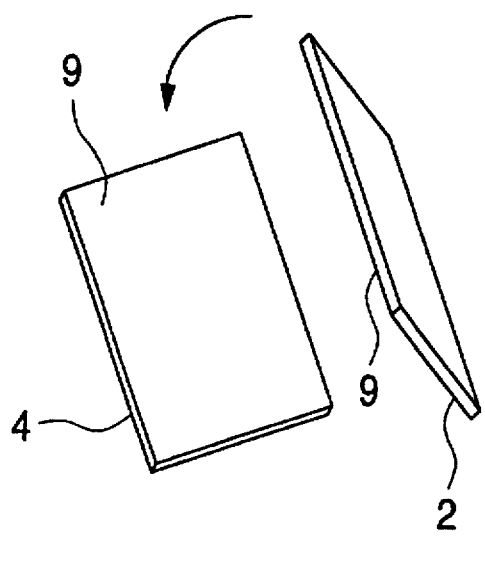
FIG. 22A is a perspective view to show a state of laminating two plastic films with their surfaces facing each other and 22B is a sectional view to show a state of laminating two plastic films with their surfaces facing each other.
Figure 22B:
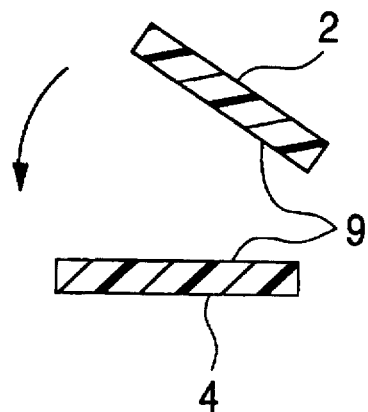

On the other hand, aside from the plastic film laminate, a flexible printed circuit of a 3-film-layer structure formed with metal electric circuit was manufactured. That is, the same film-7, film-8, and film-10 as described above were prepared. As shown in FIG. 19, a polyester family thermosetting adhesive shaped like a sheet was used to form an adhesive layer 8 on the surfaces of film-7 and film-8 in a similar manner to that described above, then copper electric circuit 3 0.035 mm thick was formed on the adhesive layer 8 by the subtractive method as in Embodiment 1. As shown in FIG. 19, a polyester family thermosetting adhesive shaped like a sheet was used to form an adhesive layer 8 on the surface and rear face of film-10 in a similar manner to that described above. As shown in the figure, with the surfaces of film-7 and film-8 facing each other with film-10 between, the three films were temporarily crimped by the roll laminate method, then cured in an autoclave (conditions: 110° C.×2 h×10 kg/cm$^2$) for manufacturing a flexible printed circuit of a 3-film-layer structure as shown in FIG. 20. Parts identical with those previously described with reference to FIG. 19 are denoted by the same reference numerals in FIG. 20.

For the flexible printed circuit of the 3-film-layer structure, the curl amount h was measured as described above. As a result, the curl amount h was 5.0 mm and the curl degree was 1.4%; curl occurrence was suppressed.

COMPARISON 3

Figure 11:
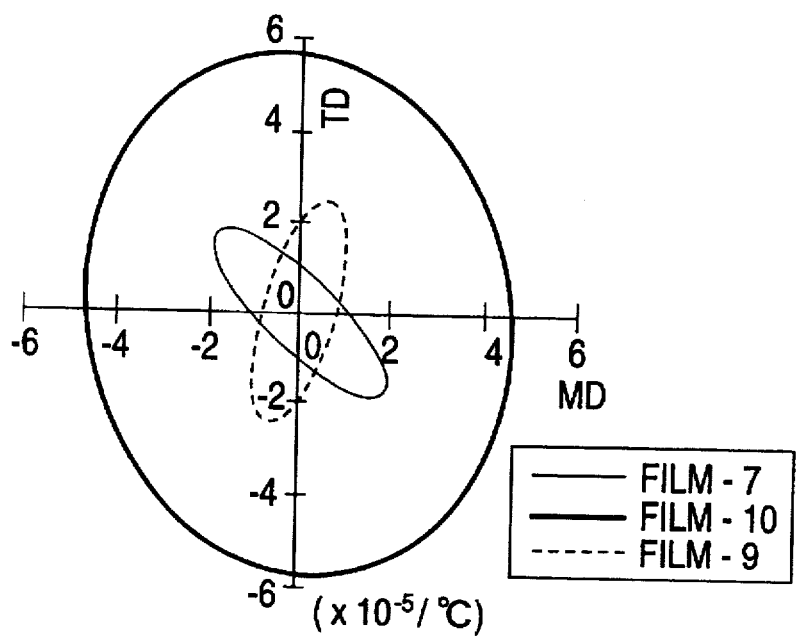
FIG. 11 is a polar coordinate plot chart of overlapping three linear expansion coefficient ellipses in Comparison 3.

A new plastic film (film-9) having a size of 200×360 mm was cut out from the polyethylene terephthalate film 0.125 mm thick used with Embodiment 3. On the other hand, the same film-7 and film-10 as in Embodiment 3 were prepared. Three linear expansion coefficient ellipses were created and overlapped as in Embodiment 3. These overlapped ellipses are shown in a graph of FIG. 11. From this graph, the maximum values of the linear expansion coefficient differences among film-7, film-9, and film-10 were calculated as in Embodiment 1. As a result, the maximum value of the linear expansion coefficient difference between film-7 and film-9 was 1.66×10$^{-5}$ (1/°C.) and that between film-9 and film-10 was 4.17×10$^{-5}$ (1/°C.). As described above, the maximum value of the linear expansion coefficient difference between film-7 and film-10 is 4.49×10$^{-5}$ (1/°C.).

Next, a plastic film laminate of a 3-film-layer structure (see FIG. 13) was created in the same manner to that in Embodiment 3 except that film-9 was used in place of film-8. The curl amount h of the plastic film laminate was measured as in Embodiment 3. As a result, the curl amount h was 18.7 mm and the curl degree was 5.2%; a curl occurred.

On the other hand, aside from the plastic film laminate, a flexible printed circuit formed with metal electric circuit was manufactured. That is, the same film-7, film-9, and film-10 as described above were prepared. An adhesive layer 8 and copper electric circuit were formed on the surfaces of film-7 ad film-9 by the subtractive method as in Embodiment 3. An adhesive layer 8 was formed on the surface and rear face of film-10. In a similar manner to that in Embodiment 3, the three films were laminated (see FIG. 19) to manufacture a flexible printed circuit (see FIG. 20). For this flexible printed circuit, the curl amount h was measured as described above. As a result, the curl amount h was 18.9 mm and the curl degree was 5.3%; a curl occurred.

EMBODIMENT 4

A bidirectionally stretched polyethylene terephthalate film 0.050 mm thick (manufactured by TORAY) was used a raw material film, from which plastic films (film-11 and film-12) each having a size of 100×200 mm were cut out.

Figure 12:
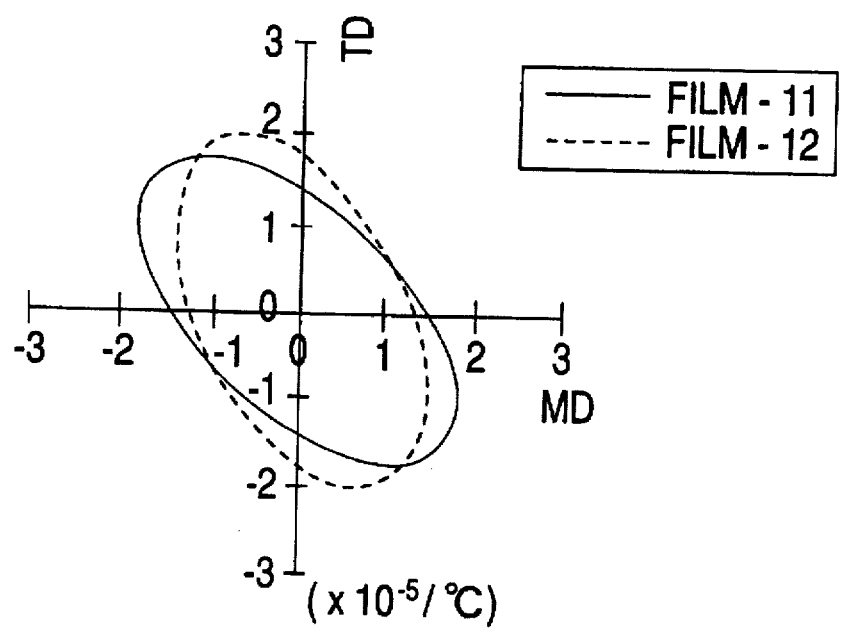
FIG. 12 is a polar coordinate plot chart of overlapping two linear expansion coefficient ellipses in Embodiments 4 and 5 and Comparisons 4 and 5.

Linear expansion coefficients were measured by the above-described TMA method and linear expansion coefficient ellipses were created by polar coordinate plotting and were overlapped. These overlapped ellipses are shown in a graph of FIG. 12. From this graph, the maximum value of the linear expansion coefficient difference between film-11 and film 12 (Δα) was calculated as in Embodiment 1. The calculation result was 0.11×10$^{-55}$ (1/°C.).

Stainless steel foil 0.050 mm thick was used as raw material of metal electric circuit 3, from which stainless steel foil having a size of 100×200 mm was cut out. The tensile modulus of the stainless steel foil was measured by the above-described method. The measurement result was 10000 kg/mm$^2$. That is, the product of the thickness and the tensile modulus (K) was 500 kg/mm.

Figure 23:
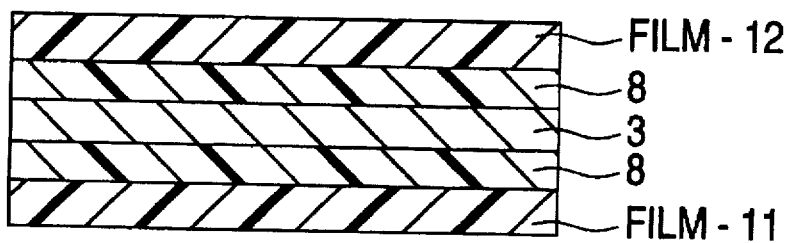
FIG. 23 is a sectional view to show the structure of a flexible printed circuit with metal foil pieces laminated.

Next, a polyester family thermosetting adhesive applied onto a separator was stuck on the same surfaces 9 of plastic film-11 and plastic film-12, then the separator was removed to form an adhesive layer 0.025 mm thick. The stainless steel foil was temporarily crimped on the surface of film-11 by the roll laminate method, then the stainless steel foil and film-12 were furthermore temporarily crimped by the roll laminate method with the surfaces of the stainless steel foil and film-12 facing each other and were laminated by crimping by a heat press (conditions: 150° C.×1 h×30 kg/cm$^2$). (See FIG. 23.)

The curl amount h of the plastic film laminate was measured by the above-described method. As a result, the curl amount h was 0.8 mm and the curl degree was 0.4%; curl occurrence was suppressed.

The flexibility of the plastic film laminate (repulsion force g/cm) was measured by the above-described method. As a result, when bend radius R=5 mm, repulsion force=160 g/cm, indicating good flexibility.

COMPARISON 4

First, the same films as the polyethylene terephthalate film used with Embodiment 4 (film-11 and film-12) were prepared. As in Embodiment 4, linear expansion coefficients were measured and linear expansion coefficient ellipses were created by polar coordinate plotting and overlapped (see FIG. 12). As in Embodiment 4, the maximum value of the linear expansion coefficient difference between film-11 and film 12 (Δα) was calculated. The calculation result was 0.11×10$^{-5}$ (1/°C.) as in Embodiment 4.

Stainless steel foil 0.075 mm thick was used as raw material of metal electric circuit 3, from which stainless steel foil having a size of 100×200 mm was cut out. The tensile modulus of the stainless steel foil was measured by the above-described method. The measurement result was 8000 kg/mm$^2$. That is, the product of the thickness and the tensile modulus (K) was 600 kg/mm, which exceeded the predetermined value.

Next, an adhesive layer 0.025 mm thick was formed on the same surfaces 9 of film-11 and film-12 as in Embodiment 4. The stainless steel foil was temporarily crimped on the surface of film-11 by the roll laminate method, then the stainless steel foil and film-12 were furthermore temporarily crimped by the roll laminate method with the surfaces of the stainless steel foil and film-12 facing each other and were laminated by crimping by a heat press (conditions: 150° C.×1 h×30 kg/cm$^2$). (See FIG. 23.)

The curl amount h of the plastic film laminate was measured by the above-described method. As a result, the curl amount h was 0.4 mm and the curl degree was 0.2%; curl occurrence was suppressed in both cases.

The flexibility of the plastic film laminate (repulsion force g/cm) was measured by the above-described method. As a result, when bend radius R=5 mm, repulsion force=240 g/cm, indicating poor flexibility as compared with Embodiment 4.

EMBODIMENT 5

First, the same films as the polyethylene terephthalate film used with Embodiment 4 (film-11 and film-12) were prepared. As in Embodiment 4, linear expansion coefficients were measured and linear expansion coefficient ellipses were created by polar coordinate plotting and overlapped (see FIG. 12). As in Embodiment 4, the maximum value of the linear expansion coefficient difference between film-11 and film 12 (Δα) was calculated. The calculation result was $0.11 \times 10^{-5}$ (1/°C.) as in Embodiment 4.

Three pieces of electrodeposited copper foil 0.018 mm, 0.035 mm, and 0.070 mm thick were used as raw material of metal conductor layer 3, from which three pieces of copper foil each having a size of 100×200 mm were cut out. The tensile moduluss of the three copper foil pieces were measured by the above-described method. The measurement results were 6600 kg/mm$^2$, 6050 kg/mm$^2$, and 5500 kg/mm$^2$. That is, the product of the thickness and the tensile modulus of each copper foil piece (K) was 118.8 kg/mm, 192.5 kg/mm, or 315 kg/mm. These values were equal to or less than the predetermined value.

Next, a polyester family thermosetting adhesive applied onto a separator was stuck on the same surfaces 9 of film-11 and film-12, then the separator was removed to form an adhesive layer 0.025 mm thick. Each piece of the copper foil was temporarily crimped on the surface of film-11 by the roll laminate method, then the copper foil and film-12 were furthermore temporarily crimped by the roll laminate method with the surfaces of the copper foil and film-12 facing each other and were laminated by crimping by a heat press (conditions: 150° C.×1 h×30 kg/cm$^2$). (See FIG. 23.)

Further, the curl amount h of each of the plastic film laminates was measured by the above-described method. As a result, when the copper foil was 0.018 mm thick, the curl amount h was 1.2 mm and the curl degree was 0.6%; when the copper foil was 0.035 mm thick, the curl amount h was 0.7 mm and the curl degree was 0.35%; when the copper foil was 0.070 mm thick, the curl amount h was 0.5 mm and the curl degree was 0.25%. Curl occurrence was suppressed in every case.

The flexibility of each of the plastic film laminates (repulsion force g/cm) was measured by the above-described method. As a result, when the copper foil was 0.018 mm thick, repulsion force=57 g/cm when bend radius R=5 mm; when the copper foil was 0.035 mm thick, repulsion force= 72 g/cm when bend radius R=5 mm; when the copper foil was 0.070 mm thick, repulsion force=125 g/cm when bend radius R=5 mm. Good flexibility was indicated in every case.

COMPARISON 5

First, the same films as the polyethylene terephthalate film used with Embodiment 4 (film-11 and film-12) were prepared. As in Embodiment 4, coefficients of linear expansion were measured and linear expansion coefficient ellipses were created by polar coordinate plotting and overlapped (see FIG. 12). As in Embodiment 4, the maximum value of the linear expansion coefficient difference between film-11 and film 12 (Δα) was calculated. The calculation result was $0.11 \times 10^{-5}$ (1/°C.) as in Embodiment 4.

Two pieces of electrodeposited copper foil 0.2 mm, and 0.3 mm thick were used as raw material of metal conductor layer 3, from which two pieces of electrodeposited copper foil each having a size of 100×200 mm were cut out. The tensile moduluss of the two electrodeposited copper foil pieces were measured by the above-described method. The measurement results were 3600 kg/mm$^2$ and 3400 kg/mm$^2$. That is, the product of the thickness and the tensile modulus of each electrodeposited copper foil piece (K) was 720 kg/mm or 1020 kg/mm. These values exceeded the predetermined value.

Next, an adhesive layer 0.025 mm thick was formed on the same surfaces 9 of film-11 and film-12 as in Embodiment 4. Each piece of the electrodeposited copper foil was temporarily crimped on the surface of film-11 by the roll laminate method, then the electrodeposited copper foil and film-12 were furthermore temporarily crimped by the roll laminate method with the surfaces of the electrodeposited copper foil and film-12 facing each other and were laminated by crimping by a heat press (conditions: 150° C.×1 h×30 kg/cm$^2$). (See FIG. 23.)

The curl amount h of each of the plastic film laminates was measured by the above-described method. As a result, when the electrodeposited copper foil was 0.2 mm thick, the curl amount h was 0.6 mm and the curl degree was 0.3%; when the electrodeposited copper foil was 0.3 mm thick, the curl amount h was 0.3 mm and the curl degree was 0.15%. Curl occurrence was suppressed in both cases.

The flexibility of each of the plastic film laminates (repulsion force g/cm) was measured by the above-described method. As a result, when the electrodeposited copper foil was 0.2 mm thick, repulsion force=615 g/cm when bend radius R=5 mm; when the electrodeposited copper foil was 0.3 mm thick, repulsion force=710 g/cm when bend radius R=10 mm. Poor flexibility was indicated in both cases as compared with Embodiment 4.

EMBODIMENT 6

Figure 30:
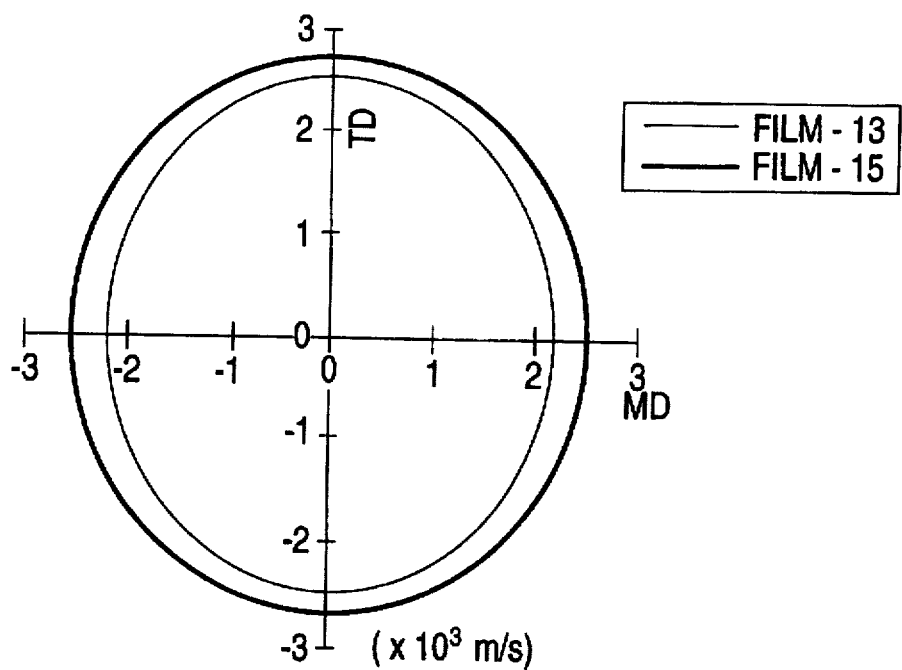
FIG. 30 is a polar coordinate plot chart of overlapping three ultrasonic propagation velocity ellipses in Embodiment 6.

A bidirectionally stretched polyethylene terephthalate film 0.05 mm thick (manufactured by TORAY) was used a raw material film, from which plastic films (film-13 and film-14) each having a size of 100×200 mm were cut out. A bidirectionally stretched polyethylene terephthalate film 0.25 mm thick (manufactured by TORAY) was used a raw material film, from which a plastic film (film-15) having a size of 100×200 mm were cut out. The ultrasonic propagation velocities of the three plastic films were measured by the above-described method and three ultrasonic propagation velocity ellipses were created by polar coordinate plotting and were overlapped. These overlapped ellipses of film-13 and film-15 are shown in a graph of FIG. 30. This graph indicates that the shift angle difference between crystal orientation main axis directions of film-13 and film-15 of the outermost layers (Δθ) is 0 degrees, showing that both match.

Next, a polyester family thermosetting adhesive was applied to the surfaces of film-13, film-14, and film-15, then dried to form an adhesive layer 0.025 mm thick. Film-13 and film-14 were laminated by crimping by a heat press (conditions: 150° C.×1 h×30 kg/cm$^2$) with the surfaces of film-13 and film-14 facing each other. Reinforcing film-15 was temporarily crimped on the rear face of film-14 by the roll laminate method, then cured in an autoclave (conditions: 110° C.×2 h×10 kg/cm$^2$). The curl amount h of the plastic film laminate was measured by the above-described method. As a result, the curl amount h was 5.0 mm and the curl degree was 2.5%; curl occurrence was suppressed. Ten flexible printed circuits thus manufactured were prepared and the relative permittivity of each flexible printed circuit as a complex of plastic films and adhesive layers was measured at measurement frequency 1 MHz. Resultantly, the relative permittivities of all flexible printed circuits fell within 3.40±0.01.

COMPARISON 6

Figure 31:
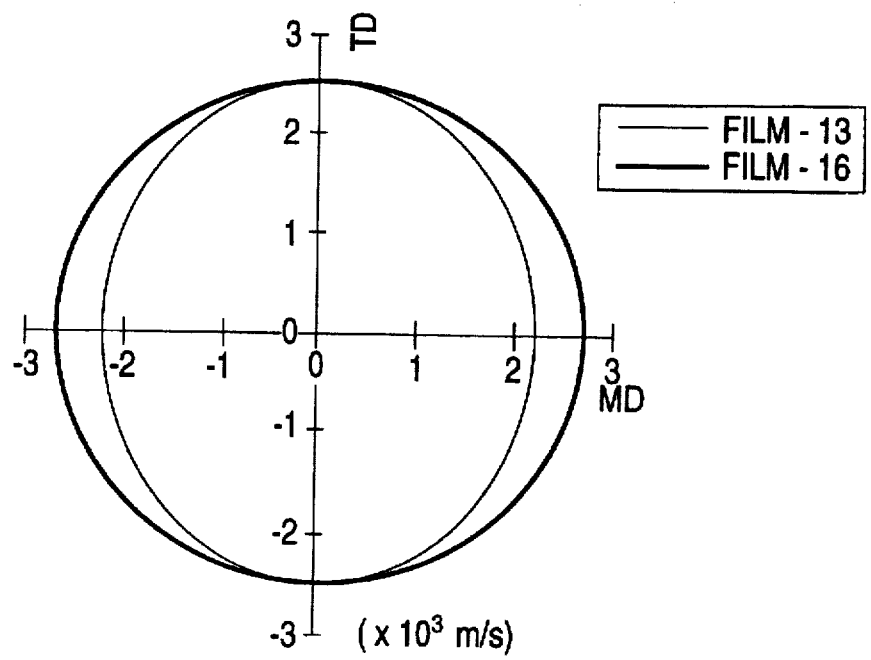
FIG. 31 is a polar coordinate plot chart of overlapping three ultrasonic propagation velocity ellipses in Comparison 6.

A new plastic film having a size of 100×200 mm (film-16) was cut out from the polyethylene terephthalate film used with Embodiment 6. On the other hand, the same film-13 and film-14 as in Embodiment 6 were prepared. The ultrasonic propagation velocity ellipses of the three plastic films were created and were overlapped as in Embodiment 6. These overlapped ellipses of film-13 and film-16 are shown in a graph of FIG. 31. This graph indicates that the shift angle difference between crystal orientation main axis directions of film-13 and film-16 of the outermost layers ($\Delta\theta$) is 90 degrees, showing a large shift.

As in Embodiment 6, a plastic film laminate of film-13 and film-16 was created and reinforcing film-16 was temporarily crimped on the rear face of film-14 by the roll laminate method, then they were crimped by a heat press (conditions: 130×1 h×30 kg/cm$^2$) to form a plastic film laminate. The curl amount h of the plastic film laminate was measured by the above-described method. As a result, the curl amount h was 19.0 mm and the curl degree was 9.5%; a curl occurred. Ten flexible printed circuits thus manufactured were prepared and the relative permittivity of each flexible printed circuit as a complex of plastic films and adhesive layers was measured at measurement frequency 1 MHz. Resultantly, the relative permittivities of the flexible printed circuits varied in the range of 3.35–3.42.

EMBODIMENT 7

Figure 32:
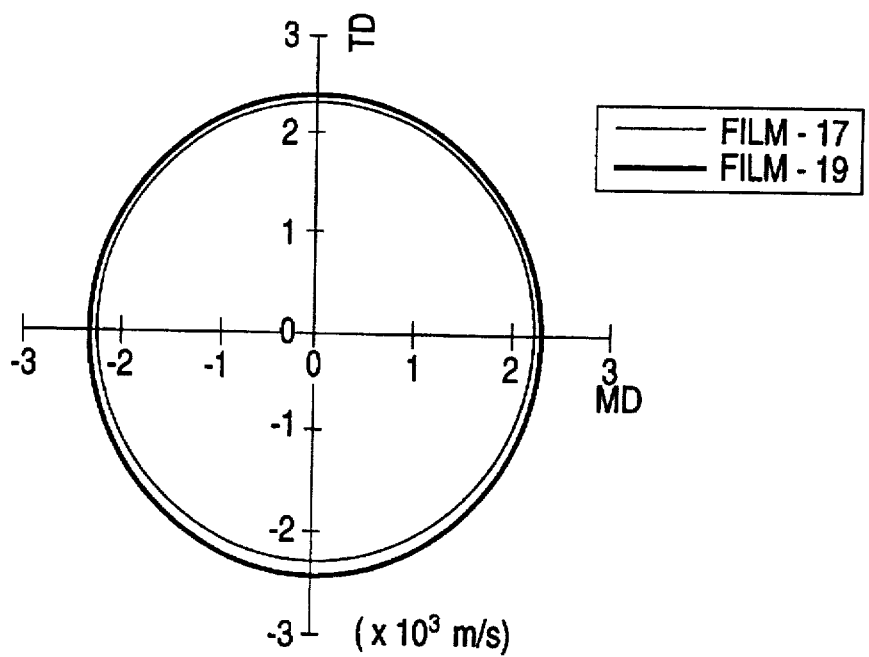
FIG. 32 is a polar coordinate plot chart of overlapping three ultrasonic propagation velocity ellipses in Embodiment 7.

A bidirectionally stretched polyimide film 0.050 mm thick (manufactured by TORAY-Dupont) was used a raw material film, from which plastic films (film-17 and film-18) each having a size of 100×200 mm were cut out. A bidirectionally stretched polyimide film 0.125 mm thick (manufactured by TORAY-Dupont) was used a raw material film, from which a plastic film (film-19) having a size of 100×200 mm were cut out. The ultrasonic propagation velocities of the three plastic films were measured by the above-described method and three ultrasonic propagation velocity ellipses were created by polar coordinate plotting and were overlapped. These overlapped ellipses of film-17 and film-19 are shown in a graph of FIG. 32. This graph indicates that the shift angle difference between crystal orientation main axis directions of film-17 and film-19 of the outermost layers ($\Delta\theta$) is 0 degrees, showing that both match.

Next, a polyester family thermosetting adhesive was applied to the surfaces of film-17, film-18, and film-19, then dried to form an adhesive layer 0.025 mm thick. Film-17 and film-18 were laminated by crimping by a heat press (conditions: 150° C.×1 h×30 kg/cm$^2$) with the surfaces of film-17 and film-18 facing each other. Reinforcing film-19 was temporarily crimped on the rear face of film-18 by the roll laminate method, then cured in an autoclave (conditions: 110° C.×2 h×10 kg/cm$^2$). The curl amount h of the plastic film laminate was measured by the above-described method. As a result, the curl amount h was 0.5 mm and the curl degree was 0.25%; curl occurrence was suppressed. Ten flexible printed circuits thus manufactured were prepared and the relative permittivity of each flexible printed circuit as a complex of plastic films and adhesive layers was measured at measurement frequency 1 MHz. Resultantly, the relative permittivities of all flexible printed circuits fell within 3.45±0.01.

COMPARISON 7

Figure 33:
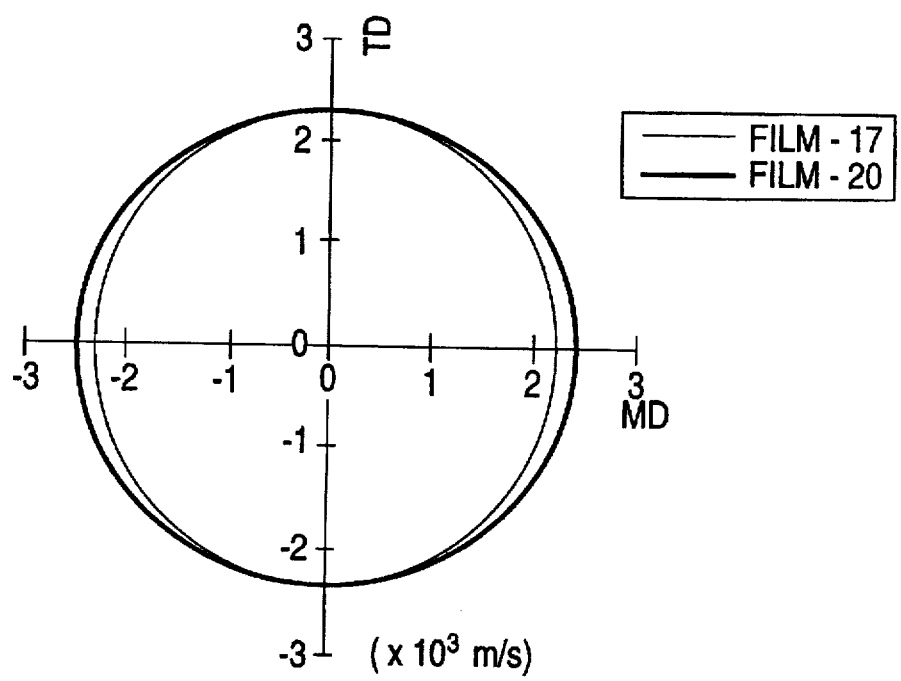
FIG. 33 is a polar coordinate plot chart of overlapping three ultrasonic propagation velocity ellipses in Comparison 7.
Figure 34:
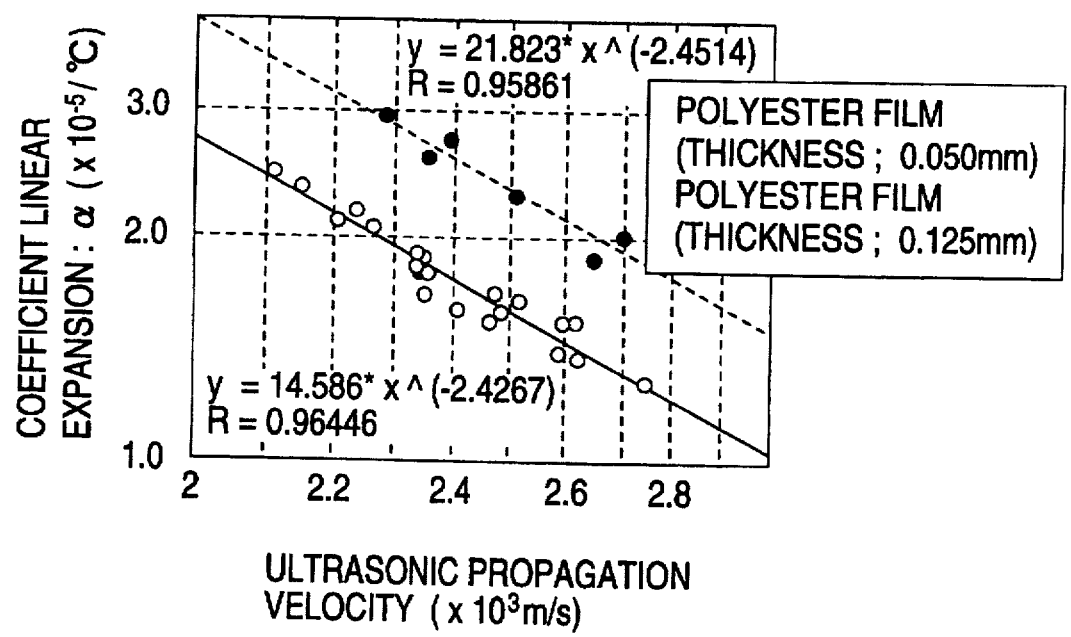
FIG. 34 is a graph to show the relationship between linear expansion coefficients and ultrasonic propagation velocities.

A new plastic film having a size of 100×200 mm (film-20) was cut out from the polyimide film used with Embodiment 7. On the other hand, the same film-17 and film-18 as in Embodiment 7 were prepared. The ultrasonic propagation velocity ellipses of the three plastic films were created and were overlapped as in Embodiment 7. These overlapped ellipses of film-17 and film-20 are shown in a graph of FIG. 33. This graph indicates that the shift angle difference between crystal orientation main axis directions of film-17 and film-20 of the outermost layers ($\Delta\theta$) is 90 degrees, showing a large shift.

As in Embodiment 7, a plastic film laminate of film-17 and film-18 was created and reinforcing film-20 was temporarily crimped on the rear face of film-18 by the roll laminate method, then they were crimped by a heat press (conditions: 150×1 h×30 kg/cm$^2$) to form a plastic film laminate. The curl amount h of the plastic film laminate was measured by the above-described method. As a result, the curl amount h was 14.0 mm and the curl degree was 7.0%; a curl occurred. Ten flexible printed circuits thus manufactured were prepared and the relative permittivity of each flexible printed circuit as a complex of plastic films and adhesive layers was measured at measurement frequency 1 MHz. Resultantly, the relative permittivities of the flexible printed circuits varied in the range of 3.42 to 3.47.

EMBODIMENT 8

A bidirectionally stretched raw material plastic film made of polyethylene terephthalate 4 m wide was prepared. It was divided into eight parts like bands (each 500 mm wide) parallel with the length direction (machine direction of stretch) of the plastic film, as shown in FIG. 36. In the raw material plastic film, the linear expansion coefficients of the parts (divisions) were measured as in Embodiment 1, and combinations of the relative positions were considered. The condition that the maximum value of the linear expansion coefficient difference is 1.4×10$^{-5}$ (1/°C.) or less was satisfied in the range of relative positions (−3) to (3). As shown in FIG. 36, a cover layer plastic film (film-21) having a size of 80×200 mm was cut out from the relative position (−3) and a base layer plastic film (film-22) having a size of 80×200mm was cut out from the relative position (2). For film-21 and film-22, the linear expansion coefficient differences were measured with the same surfaces of the films facing each other. The maximum value of the linear expansion coefficient difference was 0.7×10$^{-5}$ (1/°C.).

As in Embodiment 1, film-21 and film-22 were used to produce a plastic film laminate with the same surfaces facing each other. The curl amount h of the plastic film laminate was measured by the above-described method. As a result, the curl amount h was 5.6 mm and the curl degree was 2.8%; curl occurrence was suppressed.

On the other hand, aside from the plastic film laminate, a flexible printed circuit formed with metal electric circuit was manufactured. That is, the same film-21 (for the cover layer) and film-22 (for the base layer) as described above were prepared. An adhesive layer was formed on the surface of film-22 as in Embodiment 1, then electric circuit was formed, and an adhesive layer was formed on the surface of film-21. Film-21 and film-22 were laminated to manufacture a flexible printed circuit by the above-mentioned method. For this flexible printed circuit, the curl amount h was measured by the above-described method. As a result, the curl amount h was 5.3 mm and the curl degree was 2.7%; curl occurrence was suppressed.

EMBODIMENT 9

A bidirectionally stretched raw material plastic film made of polyethylene terephthalate 4.5 m wide was prepared. It was divided into nine parts like bands (each 500 mm wide) parallel with the length direction (machine direction of stretch) of the plastic film, as shown in FIG. 3. In the raw material plastic film, a cover layer plastic film (film-23) and a base layer plastic film (film-24) each having a size of 60×90 mm were cut out from the parts of the relative positions (−3) and (3) at symmetrical positions with respect to the center line parallel with the length direction (machine direction) of the raw material plastic film. As in Embodiment 1, for film-23 and film-24, the linear expansion coefficient differences were measured with the same surfaces of the films facing each other. The maximum value of the linear expansion coefficient difference was $0.1 \times 10^{-5}$ (1/°C).

As in Embodiment 1, a plastic film laminate of film-23 and film-24 was produced. The curl amount h of the plastic film laminate was measured by the above-described method. As a result, the curl amount h was 0.4 mm and the curl degree was 0.5%; curl occurrence was suppressed.

On the other hand, aside from the plastic film laminate, a flexible printed circuit formed with metal electric circuit was manufactured. That is, the same film-23 (for the cover layer) and film-24 (for the base layer) as described above were prepared. An adhesive layer was formed on the surface of film-24 as in Embodiment 1, then electric circuit was formed, and an adhesive layer was formed on the surface of film-23. Film-23 and film-24 were laminated to manufacture a flexible printed circuit by the above-mentioned method. For this flexible printed circuit, the curl amount h was measured by the above-described method. As a result, the curl amount h was 0.3 mm and the curl degree was 0.3%; curl occurrence was suppressed.

COMPARISON 8

The same film-23 and film-24 as in Embodiment 9 were prepared. The linear expansion coefficient differences were measured in a state in which the surface of film-23 and the rear face of film-24 face each other. The maximum value of the linear expansion coefficient difference was $1.6 \times 10^{-5}$ (1/°C). In a state in which the surface of film-23 and the rear face of film-24 face each other, a plastic film laminate was produced as in Embodiment 9, and the curl amount h was measured by the above-described method. As a result, the curl amount h was 5.9 mm and the curl degree was 6.6%; a curl occurred.

It is to be understood that the foregoing description and the accompanying drawings are not intended to limit the scope of this invention; rather, various modifications or variations may be made by those of ordinary skill in the art without departing from the scope of this invention which is defined by the appended claims. For example, the present invention also can be applied to an ordinary composite sheet not only to the flexible printed circuit. The composite sheet according to the present may be also applied to IC card, credit card or the like.

What is claimed is:

1. A composite sheet comprising:

a first resin film having a first linear expansion coefficient ellipse defined by a pair of first polar coordinate axes and a first base point located at an intersection of the first axes; and a second resin film having a second linear expansion coefficient ellipse defined by a second pair of polar coordinate axes and a second base point located at an intersection of the second axes;

the second resin film being laminated on the first resin film such that the second ellipse overlaps the first ellipse with the first axes coinciding with the second axes and the first base point coinciding with the second base point;

wherein the first and second linear expansion coefficient ellipses are a set of distances from the first and second base points, respectively, representing magnitudes of linear expansion coefficients of the first and second resin films, respectively, in directions having a measurement angle θ with respect to one of the first axes and the corresponding one of the second axes, respectively; and wherein a maximum difference between a linear expansion coefficient having the measurement angle θ of the first resin film and a linear expansion coefficient having the measurement angle θ of the second resin film is equal to or less than $1.4 \times 10^{-5}$ (1/° C.).

2. The composite sheet according to claim 1, wherein the first and second resin films are laminated on each other with the same surfaces thereof facing each other.

3. The composite sheet according to claim 1, wherein the composite sheet is a flexible printed circuit.

4. The composite sheet according to claim 3, wherein a metal electric circuit is formed between the first and second resin films and a product of thickness and tensile modulus of the metal electric circuit is 500 kg/mm or less.

5. The composite sheet according to claim 1, wherein a reinforcing plastic film is stuck on one side of the composite sheet and has a third linear expansion coefficient ellipse defined by a pair of third polar coordinate axes and a third base point located at the intersection of the third axes; and wherein a maximum difference between a linear expansion coefficient having the measurement angle θ of the reinforcing plastic film and a linear expansion coefficient having the measurement angle θ of one of the first and second resin films positioned on a side on which the reinforcing plastic film is not stuck is equal to or less than $1.4 \times 10^{-5}$ (1/° C.).

6. The composite sheet according to claim 1, wherein one or more other resin films are sandwiched between the first and second resin films.

7. The composite sheet according to claim 1, wherein the first and second resin film are laminated via an adhesive layer.

8. The composite sheet according to claim 7, wherein the first and second resin films stacked via the adhesive layer are temporarily crimped by a roll laminate method in stacked relation and then pressurized under gas pressure in an autoclave and crimped.

9. A composite sheet comprising:

a first resin film having a first linear expansion coefficient ellipse defined by a pair of first polar coordinate axes and a first base point located at an intersection of the first axes; and a second resin film having a second linear expansion coefficient ellipse defined by a second pair of polar coordinate axes and a second base point located at an intersection of the second axes;

the second resin film being laminated on the first resin film such that the second ellipse overlaps the first ellipse with the first axes coinciding with the second axes and the first base point coinciding with the second base point;

wherein the first and second linear expansion coefficient ellipses are a set of distances from the first and second base points, respectively, representing magnitudes of linear expansion coefficients of the first and second resin films, respectively, in directions having a measurement angle $\theta$ with respect to one of the first axes and the corresponding one of the second axes, respectively; and wherein a total area of portions where the first and second ellipses do not overlap is equal to or less than $6.5 \times 10^{-10}$ (($1/°$ C.)$\times$($1/°$ C.).

10. The composite sheet according to claim 9, wherein the first and second resin films are laminated on each other with the same surfaces thereof facing each other.

11. The composite sheet according to claim 9, wherein the composite sheet is a flexible printed circuit.

12. The composite sheet according to claim 11, wherein a metal electric circuit is formed between the first and second resin films and a product of thickness and tensile modulus of the metal electric circuit is 500 kg/mm or less.

13. The composite sheet according to claim 1, wherein a reinforcing plastic film is stuck on one side of the composite sheet and has a third linear expansion coefficient ellipse defined by a pair of third polar coordinate axes and a third base point located at the intersection of the third axes; and wherein a total nonoverlapping area of the third ellipse and the ellipse of one of the first and second resin films positioned on a side on which the reinforcing plastic film is not stuck is equal to or less than $6.5 \times 10^{-10}$ ($1/°$ C.)$\times$($1/°$ C.)).

14. The composite sheet according to claim 9, wherein one or more other resin films are sandwiched between the first and second resin films.

15. The composite sheet according to claim 9, wherein the first and second resin film are laminated via an adhesive layer.

16. The composite sheet according to claim 15, wherein the first and second resin films stacked via the adhesive layer are temporarily crimped by a roll laminate method in stacked relation and then pressurized under gas pressure in an autoclave and crimped.

17. A composite sheet comprising:

a first resin film having a first ultrasonic propagation velocity ellipse defined by a pair of first polar coordinate axes, having a crystal orientation main axis in a long-axis direction and a crystal orientation subaxis in a short-axis direction, and a first base point located at an intersection of the first axes; and a second resin film having a second ultrasonic propagation velocity ellipse defined by a second pair of polar coordinate axes, having a crystal orientation main axis in a long-axis direction and a crystal orientation subaxis in a short-axis direction, and a second base point located at an intersection of the second axes;

the second resin film being laminated on the first resin film such that the second ellipse overlaps the first ellipse with the first axes coinciding with the second axes and the first base point coinciding with the second base point;

wherein the first and second ultrasonic propagation velocity ellipses are a set of distances from the first and second base points, respectively, representing magnitudes of ultrasonic propagation velocities of the first and second resin films, respectively, in directions having a measurement angle $\theta$ with respect to one of the first axes and the corresponding one of the second axes, respectively; and wherein a shift angle difference between crystal orientation main axes of the ellipses ($\Delta\theta$) is within 30 degrees.

18. The composite sheet according to claim 17, wherein the first and second resin films are laminated on each other with the same surfaces thereof facing each other.

19. The composite sheet according to claim 17, wherein the composite sheet is a flexible printed circuit.

20. The composite sheet according to claim 19, wherein a metal electric circuit is formed between the first and second resin films and a product of thickness and tensile modulus of the metal electric circuit is 500 kg/mm or less.

21. The composite sheet according to claim 1, wherein a reinforcing plastic film is stuck on one side of the composite sheet and has a third ultrasonic propagation velocity ellipse defined by a pair of third polar coordinate axes, having a crystal orientation main axis in a long-axis direction and a crystal orientation subaxis in a short-axis direction, and a third base point located at the intersection of the third axes; and wherein a shift angle difference between a crystal orientation main axis of the third ellipse and the ellipse of one of the first and second resin films positioned on a side on which the reinforcing plastic film is not stuck is within 30 degrees.

22. The composite sheet according to claim 17, wherein one or more other resin films are sandwiched between the first and second resin films.

23. The composite sheet according to claim 17, wherein the first and second resin films are laminated via an adhesive layer.

24. The composite sheet according to claim 23, wherein the first and second resin films stacked via the adhesive layer are temporarily crimped by a roll laminate method in stacked relation and then pressurized under gas pressure in an autoclave and crimped.

25. The composite sheet according to claim 1, wherein one axis of each of the first and second axes is in a machine direction of film stretch and the other axis of each of the first and second axes is in a transverse direction of film stretch.

26. The composite sheet according to claim 1, wherein the composite sheet is a flexible printed circuit, and one axis of each of the first and second axes is in a machine direction of film stretch and the other axis of each of the first and second axes is in a transverse direction of film stretch.

27. The composite sheet according to claim 9 wherein one axis of each of the first and second axes is in a machine direction of film stretch and the other axis of each of the first and second axes is in a transverse direction of film stretch.

28. The composite sheet according to claim 9, wherein the composite sheet is a flexible printed circuit, and one axis of each of the first and second axes is in a machine direction of film stretch and the other axis of each of the first and second axes is in a transverse direction of film stretch.

29. The composite sheet according to claim 17, wherein one axis of each of the first and second axes is in a machine direction of film stretch and the other axis of each of the first and second axes is in a transverse direction of film stretch.

30. The composite sheet according to claim 17, wherein the composite sheet is a flexible printed circuit, and one axis of each of the first and second axes is in a machine direction of film stretch and the other axis of each of the first and second axes is in a transverse direction of film stretch.

31. The composite sheet according to claim 1, wherein the first and second resin films are made of the same material.

32. The composite sheet according to claim 9, wherein the first and second resin films are made of the same material.

33. The composite sheet according to claim 17, wherein the first and second resin films are made of the same material.

* * * * *